(12) United States Patent
Nishihara

(10) Patent No.: US 8,421,234 B2
(45) Date of Patent: Apr. 16, 2013

(54) SEMICONDUCTOR DEVICE AND METHOD OF MANUFACTURING THE SAME

(75) Inventor: Kiyohito Nishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 12/833,329

(22) Filed: Jul. 9, 2010

(65) Prior Publication Data

US 2011/0006435 A1    Jan. 13, 2011

(30) Foreign Application Priority Data

Jul. 13, 2009    (JP) ................. 2009-164540

(51) Int. Cl.
*H01L 23/48* (2006.01)

(52) U.S. Cl.
USPC .... 257/773; 257/774; 257/390; 257/E23.011; 257/E21.584; 438/653; 438/654; 438/668

(58) Field of Classification Search ............... 257/773, 257/774, 390, E23.011, E21.584; 438/653, 438/654, 668

See application file for complete search history.

(56) References Cited

U.S. PATENT DOCUMENTS

| 6,699,750 | B1 * | 3/2004 | Rupp ........................ 438/243 |
| 7,272,040 | B2 * | 9/2007 | Mikolajick et al. ...... 365/185.03 |
| 2006/0220103 | A1 * | 10/2006 | Watanobe et al. ............ 257/316 |
| 2007/0002622 | A1 | 1/2007 | Matsunaga et al. |
| 2009/0014771 | A1 | 1/2009 | Ide et al. |
| 2009/0091040 | A1 | 4/2009 | Uchida et al. |

FOREIGN PATENT DOCUMENTS

JP    2009-10011    1/2009

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

A semiconductor device according to an embodiment of the present invention includes a substrate, isolation layers and active regions formed in the substrate, and arranged alternately along a first direction parallel to a surface of the substrate, an inter layer dielectric formed on the isolation layers and the active regions, and having holes for respective contact plugs on the respective active regions, barrier layers formed in the holes, each of the barrier layers being formed on a top surface of an active region exposed in a hole and on one of two side surfaces of the hole, the two side surfaces of the hole being perpendicular to the first direction, and plug material layers formed on the barrier layers in the holes.

9 Claims, 22 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2009-164540, filed on Jul. 13, 2009, the entire contents of which are incorporated herein by reference.

BACKGROUND OF THE INVENTION

1. Field of the Invention

The present invention relates to a semiconductor device and a method of manufacturing the same, for example, to a nonvolatile semiconductor memory such as a NAND flash EEPROM of a charge trap type or a floating gate type.

2. Background Art

In general, when forming bit line contact plugs in a NAND device, contact holes are formed on respective active regions between select gates, a barrier metal is deposited on bottom and side surfaces of the contact holes, and a plug material is buried in the contact holes via the barrier metal. In such a manner, the contact plugs each including a barrier metal layer and a plug material layer is formed in the contact holes (see, JP-A 2009-10011 (KOKAI), for example).

However, if such a structure is adopted in a fine NAND device, the percentage of the barrier metal layer that occupies a horizontal cross section of a contact plug (i.e., a cross section perpendicular to a current flowing direction) becomes large. This is because the width of the active region and the diameter of the contact plug become smaller by shrinking in a size of the NAND device. The larger percentage of the barrier metal layer that occupies the cross section of the contact plug results in a problem of an increase in resistivity of the contact plug, for example.

SUMMARY OF THE INVENTION

An aspect of the present invention is, for example, a semiconductor device including a substrate, isolation layers and active regions formed in the substrate, and arranged alternately along a first direction parallel to a surface of the substrate, an inter layer dielectric formed on the isolation layers and the active regions, and having holes for respective contact plugs on the respective active regions, barrier layers formed in the holes, each of the barrier layers being formed on a top surface of an active region exposed in a hole and on one of two side surfaces of the hole, the two side surfaces of the hole being perpendicular to the first direction, and plug material layers formed on the barrier layers in the holes.

Another aspect of the present invention is, for example, a semiconductor device including a substrate, isolation layers and active regions formed in the substrate, and arranged alternately along a first direction parallel to a surface of the substrate, an inter layer dielectric formed on the isolation layers and the active regions, and having first and second holes for first and second contact plugs on first and second active regions of the active regions, the first and second holes being adjacent to each other in the first direction, a first barrier layer formed on a top surface of the first active region exposed in the first hole and on one of two side surfaces of the first hole, the two side surface of the first hole being perpendicular to the first direction, the one of the two side surfaces of the first hole being opposite the second hole, a second barrier layer formed on a top surface of the second active region exposed in the second hole and on one of two side surfaces of the second hole, the two side surface of the second hole being perpendicular to the first direction, the one of the two side surfaces of the second hole being opposite the first hole, a first plug material layer formed on the first barrier layer in the first hole, and a second plug material layer formed on the second barrier layer in the second hole.

Another aspect of the present invention is, for example, a method of manufacturing a semiconductor device, the method including forming a first inter layer dielectric on a substrate in which isolation layers and active regions are alternately provided along a first direction parallel to a surface of the substrate, forming, in the first inter layer dielectric, a hole which ranges from a first active region to a second active region of the active regions, thereby exposing the substrate in the hole, forming a barrier layer on top and side surfaces of the hole, forming a plug material layer on the top and side surfaces of the hole via the barrier layer, etching the barrier layer and plug material layer formed on the top and side surfaces of the hole, to separate the barrier layer and plug material layer formed on the first active region from the barrier layer and plug material layer formed on the second active region, and burying a second inter layer dielectric in the hole after the separation of the barrier layers and plug material layers.

DESCRIPTION OF THE EMBODIMENTS

Embodiments of the present invention will be described below with reference to the accompanying drawings.

First Embodiment

Figure 1:
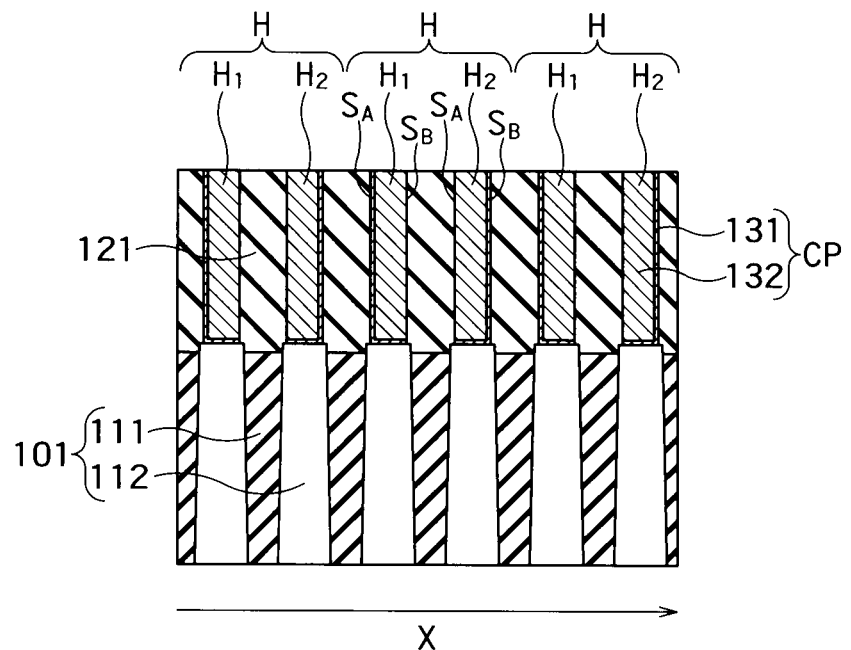
FIG. 1 is a side sectional view showing a configuration of a semiconductor device of a first embodiment.

FIG. 1 is a side sectional view showing a configuration of a semiconductor device of a first embodiment. The semiconductor device shown in FIG. 1 is a nonvolatile semiconductor memory, more specifically, a NAND flash EEPROM.

In the semiconductor device of FIG. 1, isolation layers 111 which are STI (Shallow Trench Isolation) regions and active regions 112 which are AA (Active Area) regions are formed in a substrate 101. As shown in FIG. 1, the isolation layers 111 and the active regions 112 are alternately provided along a predetermined direction parallel to the surface of the substrate 101. In FIG. 1, the predetermined direction is indicated by an arrow X. The predetermined direction (X-direction) is an example of a first direction of the present invention.

An inter layer dielectric 121 is formed on the isolation layers 111 and the active regions 112, and the inter layer dielectric 121 is provided with holes H. In FIG. 1, each of the holes H is divided into two separate holes by the inter layer dielectric 121, and the left hole is indicated by $H_1$ and the right hole is indicated by $H_2$ in the figure. The holes $H_1$ and $H_2$ are provided on the respective active regions 112, and each of the holes $H_1$ and $H_2$ is a hole for a contact plug. In FIG. 1, a contact plug CP is formed in each of the holes $H_1$ and $H_2$, and the inter layer dielectric 121 is formed between the contact plugs CP. Details of the holes H will be described later. In FIG. 1, two side surfaces of each of the holes $H_1$ and $H_2$ are indicated by $S_A$ and $S_B$. The side surfaces $S_A$ and $S_B$ are perpendicular to the X-direction. In FIG. 1, the left side surface and the right side surface of each of the holes $H_1$ and $H_2$ are indicated by $S_A$ and $S_B$, respectively.

Hereinafter, the holes $H_1$ and $H_2$ are integrally written as $H_N$ (N is 1 or 2) appropriately. For example, an expression "each hole $H_N$" means each of the holes $H_1$ and $H_2$.

Barrier metal layers 131 and plug material layers 132 forming the contact plugs CP are formed in the holes $H_N$. In each of the holes $H_N$, a barrier metal layer 131 is formed on a top surface of an active region 112 exposed in the hole $H_N$, and on one of the two side surfaces ($S_A$ and $S_B$) of the hole $H_N$ perpendicular to the X-direction. Further, in each of the holes $H_N$, a plug material layer 132 is formed on the barrier metal layer 131. The plug material layer 132 is formed so that it may be buried in a region surrounded by the inter layer dielectric 121 and the barrier metal layer 131.

In general, the resistivity of plug material of the plug material layers 132 is lower than that of metal material of the barrier metal layers 131. The metal material of the barrier metal layers 131 is, for example, titanium (Ti). The plug material of the plug material layer 132 is, for example, tungsten (W). The barrier metal layer 131 prevents a trouble from occurring in a case where the plug material layer 132 and the active region 112 comes in direct contact with each other. The barrier metal layer 131 is an example of a barrier layer in the present invention.

In such a manner, in the present embodiment, each of the barrier metal layers 131 is formed on the bottom surface of the hole $H_N$ and on only one of the two side surfaces of the hole $H_N$ perpendicular to the X-direction. In other words, each of the barrier metal layers 131 is formed not on the entire side surfaces of the hole $H_N$ but on a part of the side surfaces of the hole $H_N$. Accordingly, in the present embodiment, the barrier metal layer 131 less occupies the horizontal cross section of the contact plug CP. Therefore, according to the present embodiment, for example, the contact plug CP has a smaller resistivity.

The structure provided in the present embodiment is suitable for use in a fine NAND device. This is because the width of the active region 112 and the diameter of the contact plug CP become smaller by shrinking in a size of the NAND device, so that the barrier metal layer 131 more occupies the cross section of the contact plug CP. If the barrier metal layer 131 occupies a larger percentage of the cross section of the contact plug CP, a problem will occur such as an increase in resistivity of the contact plug CP. The increase in resistivity of the contact plug CP is an obstacle to realize a preferable contact resistance. However, in the present embodiment, as described above, the barrier metal layer 131 is formed not on the entire side surfaces of the hole $H_N$ but on a part of the side surfaces, so that the barrier metal layer 131 occupies a smaller percentage of the cross section of the contact plug CP. Therefore, according to the present embodiment, in the fine NAND device, the contact plug CP has a smaller resistivity.

In FIG. 1, three pairs of the holes $H_1$ and $H_2$ are shown. One pair of the holes $H_1$ and $H_2$ are formed from one common hole H. The holes $H_1$ and $H_2$ of each pairs are adjacent to each other in the X-direction. The holes $H_1$ and $H_2$ are examples of first and second holes in the present invention, respectively.

In each of the holes $H_1$, the barrier metal layer 131 is formed on one of the side surfaces $S_A$ and $S_B$ that is an opposite side of the counterpart hole $H_2$, i.e., the side surface $S_A$.

On the other hand, in each of the holes $H_2$, the barrier metal layer 131 is formed on one of the side surfaces $S_A$ and $S_B$ that is an opposite side of the counterpart hole $H_1$, i.e., the side surface $S_B$.

As a result, in each pair, the barrier metal layer 131 in the hole $H_1$ and the barrier metal layer 131 in the hole $H_2$ are mirror-symmetrical to each other in shape. In FIG. 1, the barrier metal layer 131 in $H_1$ is L-shaped in cross section and that in $H_2$ is reverse L-shaped in cross section.

Further, in each pair, the plug material layer 132 in $H_1$ is in contact with the right side surface of $H_1$ in the figure, and the plug material layer 132 in $H_2$ is in contact with the left side surface of $H_2$ in the figure. In such a manner, in each pair, the plug material layer 132 in $H_1$ and the plug material layer 132 in $H_2$ are also mirror-symmetrical to each other in shape.

Therefore, in each pair, the contact plug CP in $H_1$ and the contact plug CP in $H_2$ are mirror-symmetrical to each other in shape.

The active region 112 under the hole $H_1$ is an example of a first active region of the present invention, and the active region 112 under the hole $H_2$ is an example of the second active region of the present invention. Further, the barrier metal layer 131 and the plug material layer 132 in the hole $H_1$ are examples of a first barrier layer and a first plug material layer of the present invention, and the barrier metal layer 131 and the plug material layer 132 in the hole $H_2$ are examples of a second barrier layer and a second plug material layer of the present invention.

Figure 2:
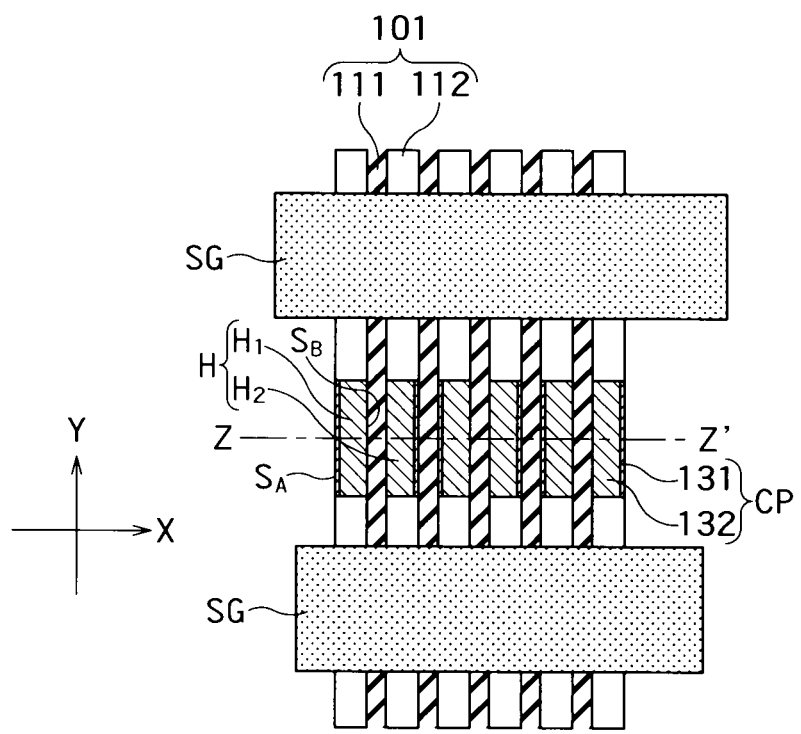
FIG. 2 is a plan view showing the configuration of the semiconductor device in FIG. 1.

FIG. 2 is a plan view showing the configuration of the semiconductor device in FIG. 1. FIG. 2 shows the substrate 101, the isolation layers 111, the active regions 112, the holes H, $H_1$, and $H_2$, the barrier metal layers 131, the plug material layers 132, and the contact plugs CP shown in FIG. 1. FIG. 1 is a sectional view taken along line Z-Z' of FIG. 2.

The contact plugs CP in the present embodiment are bit line contacts, and are positioned between select gates SG as shown in FIG. 2. FIG. 2 shows X-direction and Y-direction which are parallel to the surface of the substrate 101. The X-direction is the above described first direction, and the Y-direction is a second direction perpendicular to the first direction. In FIG. 2, the select gates SG extend in the X-direction, and the isolation layers 111 and the active regions 112 extend in the Y-direction. Further, the contact plugs CP in the present embodiment are disposed on a line in the X-direction as viewed from above the substrate 101 as shown in FIG. 2.

Further, each of the contact plugs CP has a shape of a belt that extends in the Y-direction as viewed from above the substrate 101.

Figure 3:
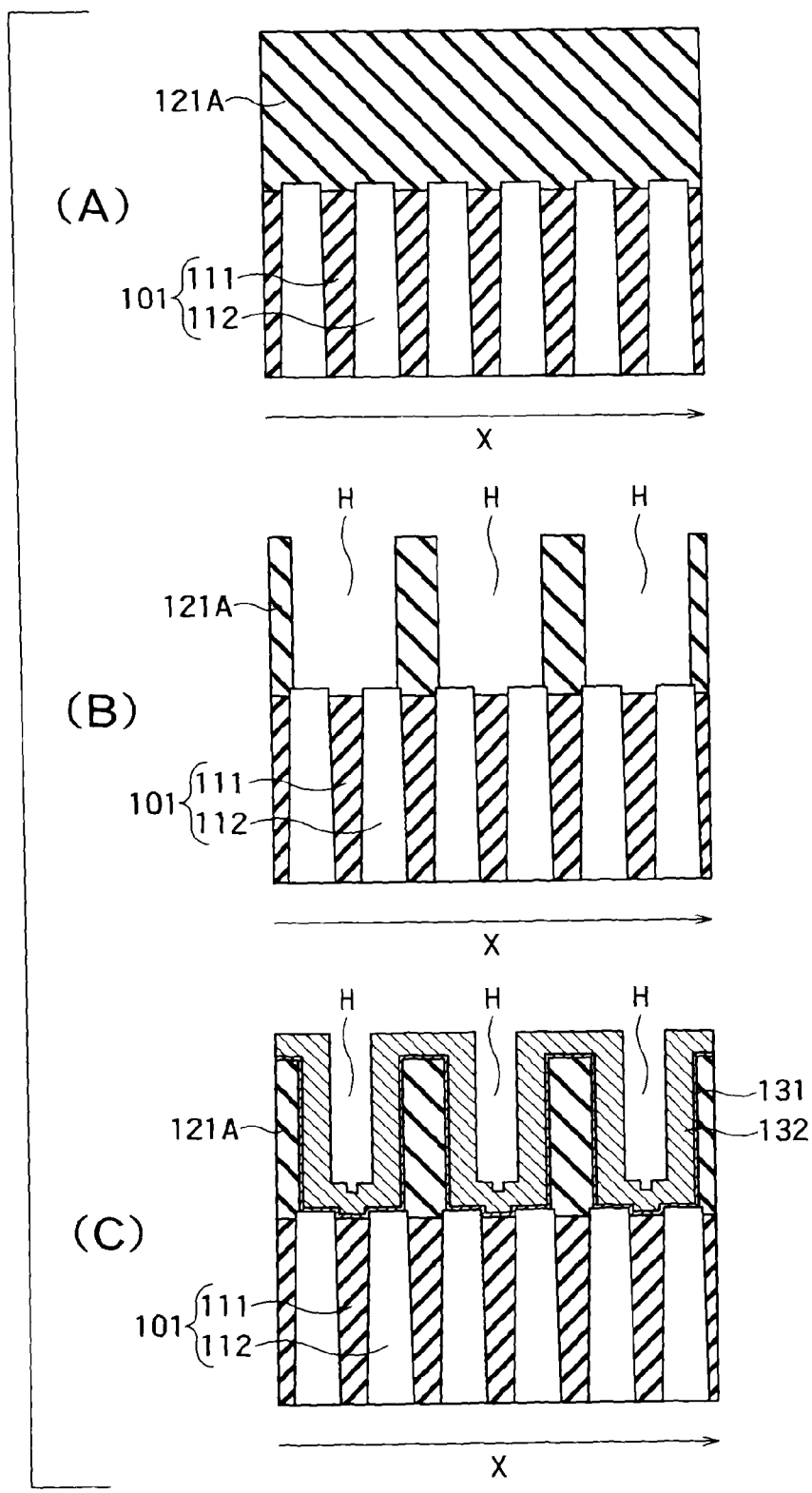
FIGS. 3 and 4 show side sectional views for illustrating an outline of a method of manufacturing the semiconductor device in FIG. 1.
Figure 4:
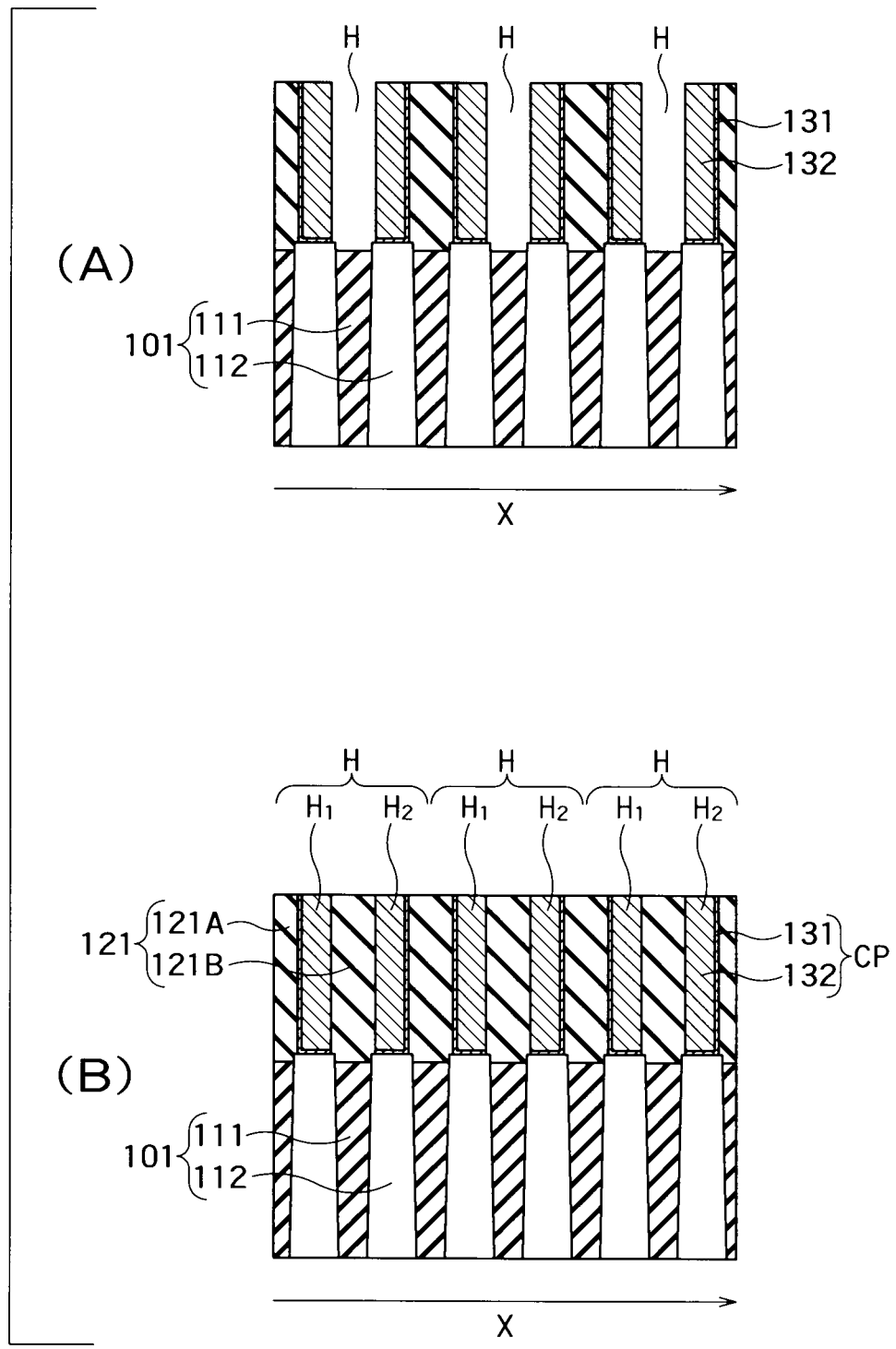

FIGS. 3 and 4 show side sectional views for illustrating an outline of a method of manufacturing the semiconductor device in FIG. 1.

As shown in FIG. 3(A), a first inter layer dielectric 121A is formed on the substrate 101 in which the isolation layers 111 and the active regions 112 are alternately provided along the X-direction parallel to the surface of the substrate 101.

As shown in FIG. 3(B), the holes H are formed in the first inter layer dielectric 121A in such a manner that each hole H is formed on two active regions 112 adjacent to each other, thereby exposing the substrate 101 in the holes H. Accordingly, the holes H are so-called "contact holes".

As shown in FIG. 3(C), the barrier metal layer 131 is deposited on the bottom and side surfaces of the holes H. The barrier metal layer 131 is made of, for example, titanium (Ti). As shown in FIG. 3(C), the plug material layer 132 is deposited via the barrier metal layer 131 on the bottom and side surfaces of the holes H. In this case, the plug material layer 132 is formed on the bottom and side surfaces of the holes H so as not to fill the holes H completely. The plug material layer 132 is made of, for example, tungsten (W).

As shown in FIG. 4(A), the barrier metal layer 131 and the plug material layer 132 are etched at a plurality of number of times so that they remain on the top surface of the active regions 112 in each hole H and on the both side surfaces of each hole H perpendicular to the X-direction. In each of the holes H, the barrier metal layer 131 and plug material layer 132 is divided into a portion on the left-side active region 112 and a portion on the right-side active region 112 in the figure. In other words, in each of the holes H, the barrier metal layer 131 and plug material layer 132 on the left-side active region 112 is separated from the barrier metal layer 131 and plug material layer 132 on the right-side active region 112. Details of the etching will be described later.

As shown in FIG. 4(B), after the division of the barrier metal layer 131 and the plug material layer 132, a second inter layer dielectric 121B is buried in the holes H in a condition where the barrier metal layers 131 and the plug material layers 132 remain in the holes H. This realizes a structure in which the contact plugs CP (the barrier metal layers 131 and the plug material layers 132) are buried in the holes $H_1$ and $H_2$ formed on both sides of each hole H.

It is to be noted that the inter layer dielectric 121 shown in FIG. 1 is formed of the first and second inter layer dielectrics 121A and 121B.

In this way, in the present embodiment, the barrier metal layer 131 and the plug material layer 132 are formed by such a side wall forming process as shown in FIG. 3(C). Accordingly, in the process in FIG. 3(B), it is not necessary to form the holes $H_N$ on the respective active regions 112, but the holes H are formed so that each hole H is formed on two active regions 112 adjacent to each other. The process of forming the hole H has an advantage of a larger margin of openings in lithography than the process of forming the hole $H_N$ on each active region 112. This is because the width of the hole $H_N$ stretches over one active region, while the width of the hole H stretches over one isolation layer and two active regions, so that the hole H has a larger width compared to the hole $H_N$. According to the present embodiment, a contact processing in a lithographic size of a larger opening margin than the conventional methods can be performed, thereby reducing the difficulty of the contact processing.

The method in the present embodiment is suitable for use in manufacturing a fine NAND device. This is because the width of each of the isolation layers 111 and the active regions 112 becomes small by shrink in the size of the NAND device, so that the formation of the hole $H_N$ on each active region 112 becomes difficult in particular. Such difficulties can be avoided by the process of FIG. 3(B) in the present embodiment because this process forms the hole H stretching over the adjacent two active region 112 rather than forming the hole $H_N$ on each of the active regions 112.

Further, in the present embodiment, by increasing the Y-directional length of the contact plug CP (see FIG. 2), an area of contact between the active region 112 and the contact plug CP can be expanded. Accordingly, in the present embodiment, the contact resistance can be decreased. Consequently, in the present embodiment, it is possible to suppress the occurrence of failures around the contacts, thereby improving the yield of the semiconductor device.

Hereafter, the first embodiment will be compared to a comparative example.

Figure 5:
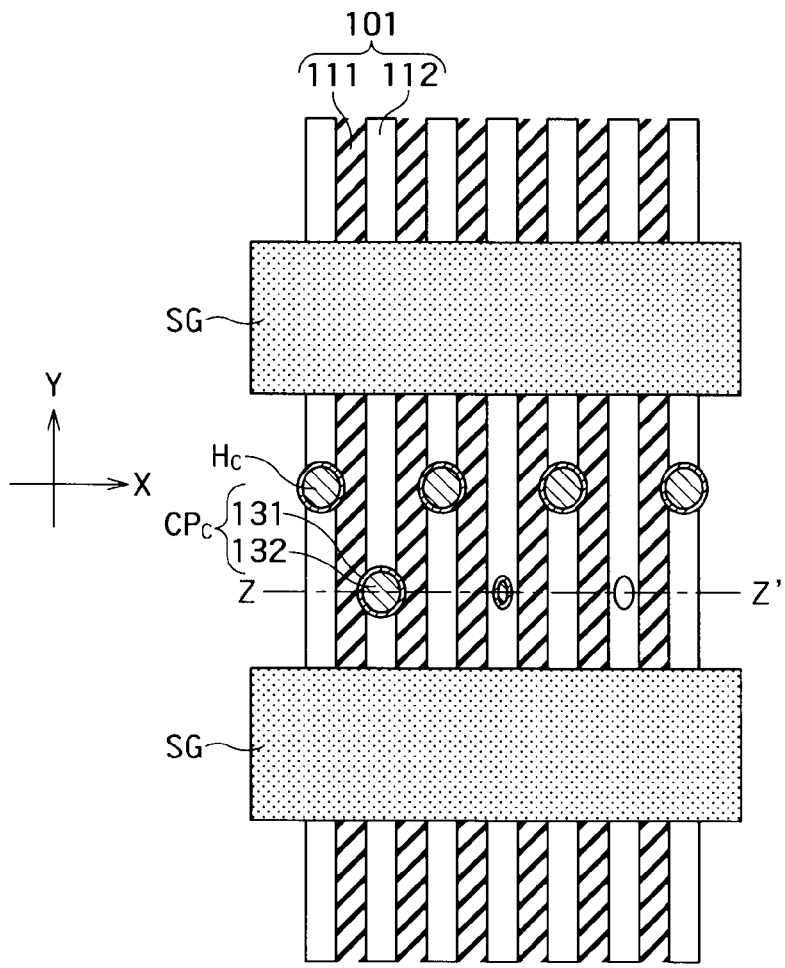
FIG. 5 is a plan view showing a configuration of a semiconductor device of a comparative example.
Figure 6:
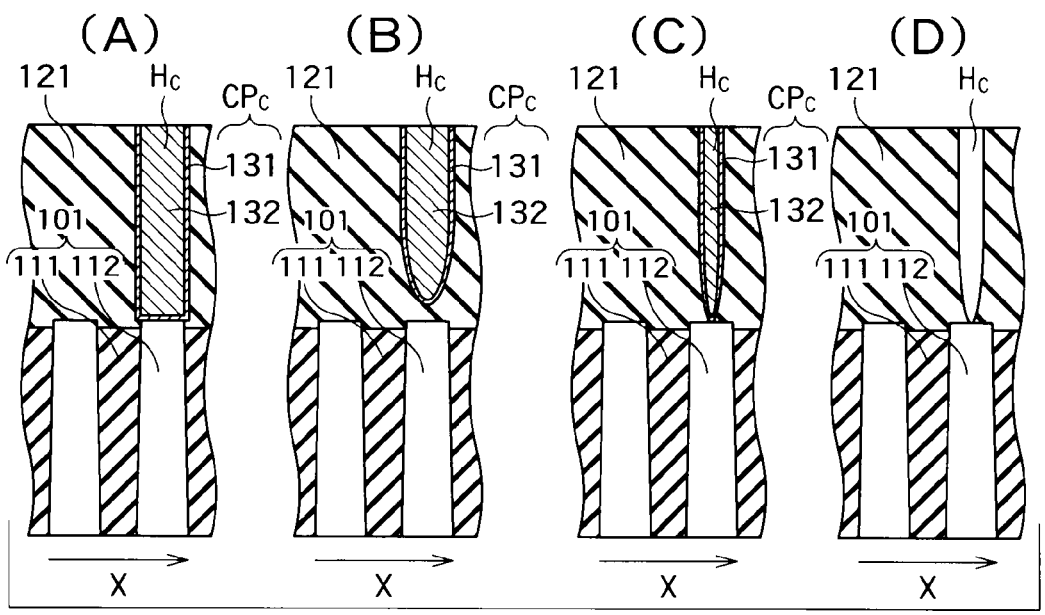
FIG. 6 illustrates side sectional views showing configurations of the semiconductor device of the comparative example.

FIGS. 5 and 6 illustrate a plan view and side sectional views showing configurations of a semiconductor device of the comparative example.

In the present comparative example, holes $H_c$ (contact holes, each having a width stretching over one active region) is formed on the respective active regions 112 between the select gates SG, a barrier metal layer 131 is deposited on the bottom and side surfaces of the holes $H_c$, and a plug material layer 132 is buried in the holes $H_c$ via the barrier metal layer 131. In such a manner, as shown in FIGS. 5 and 6(A), contact plugs $CP_c$, each of which is formed of the barrier metal layer 131 and the plug material layer 132, are formed in the holes $H_c$.

However, in the present comparative example, in the case of manufacturing a fine NAND device, due to process variations, failures may occur highly possibly around the contacts, as shown in FIGS. 6(B) to 6(D). This is because the width of each of the isolation layers 111 and the active regions 112 becomes small by shrinking in the size of the NAND device, to raise the level of difficulties in contact processing. In FIG. 6(B), the hole $H_c$ does not reach the active region 112. In FIG. 6(C), an opening area of the hole $H_c$ is decreased. In FIG. 6(D), due to the decrease in the opening area of the hole $H_c$, the hole $H_c$ is not filled with the barrier metal and the plug material.

In contrast, in the present embodiment, the hole H stretching over two active regions 112 is formed, the barrier metal layer 131 and the plug material layer 132 are deposited on the bottom and side surfaces of the hole H, and those deposited layers are etched to realize a final plug structure (see FIGS. 3 and 4). In such a manner, in the present embodiment, the plug material is buried not in the hole $H_N$ having a width that stretches over one active region but in the hole H stretching over two active regions 112, so that it is possible to avoid such situations as shown in FIGS. 6(B) to 6(D).

Hereafter, a description will be given in detail of the method of manufacturing the semiconductor device in FIG. 1.

FIGS. 7 to 18 show plan views and side sectional views for illustrating the details of the method of manufacturing the semiconductor device in FIG. 1. An A-A' sectional view, a B-B' sectional view, and a C-C' sectional view in each figure are given by taking along a line A-A', a line B-B', and a line C-C' shown in a plan view, respectively.

Figure 7:
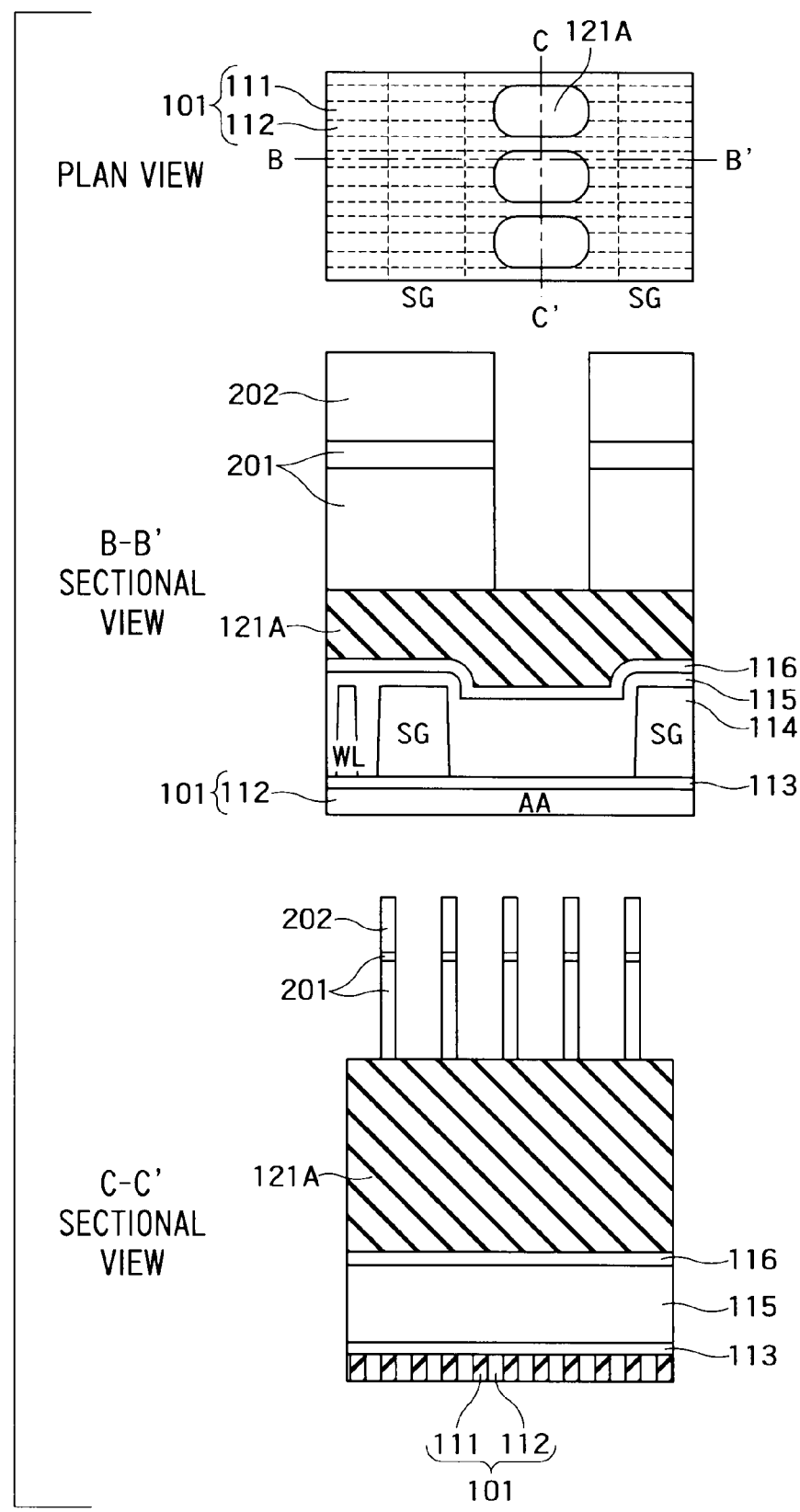
FIGS. 7 to 18 show plan views and side sectional views for illustrating the details of the method of manufacturing the semiconductor device in FIG. 1.

As shown in FIG. 7, a first inter layer dielectric 121A is formed on the substrate 101 in a condition where the isolation layers 111 and the active regions 112 are provided alternately in the substrate 101. The substrate 101 is, for example, a semiconductor substrate such as a silicon substrate. The isolation layers 111 are, for example, silicon oxide layers. The active regions 112 are regions divided by the isolation layers 111. The active regions 112 may be regions doped impurity atoms into the substrate 101. Further, the first inter layer dielectric 121A is, for example, a silicon oxide layer. A gate insulator 113, an electrode interconnect 114, and an insulating layer 115 covering the electrode interconnect 114 are formed between the substrate 101 and the first inter layer dielectric 121A. In the present embodiment, the electrode interconnect 114 is word lines WL and the select gates SG. Further, a barrier layer 116 is formed on the insulating layer 115. In FIG. 7, the isolation layers 111 and the active regions 112 extend parallel to the line B-B' and are formed alternately in a direction parallel to the line C-C'. Further, the isolation layers 111 and the active regions 112 have almost the same width along the line C-C'.

As shown in FIG. 7, a hard mask layer 201 and a resist layer 202 are formed sequentially on the first inter layer dielectric 121A. The hard mask layer 201 and the resist layer 202 are patterned by lithography and etching. Consequently, a resist pattern and a hard mask pattern for forming the holes H are formed.

Figure 8:
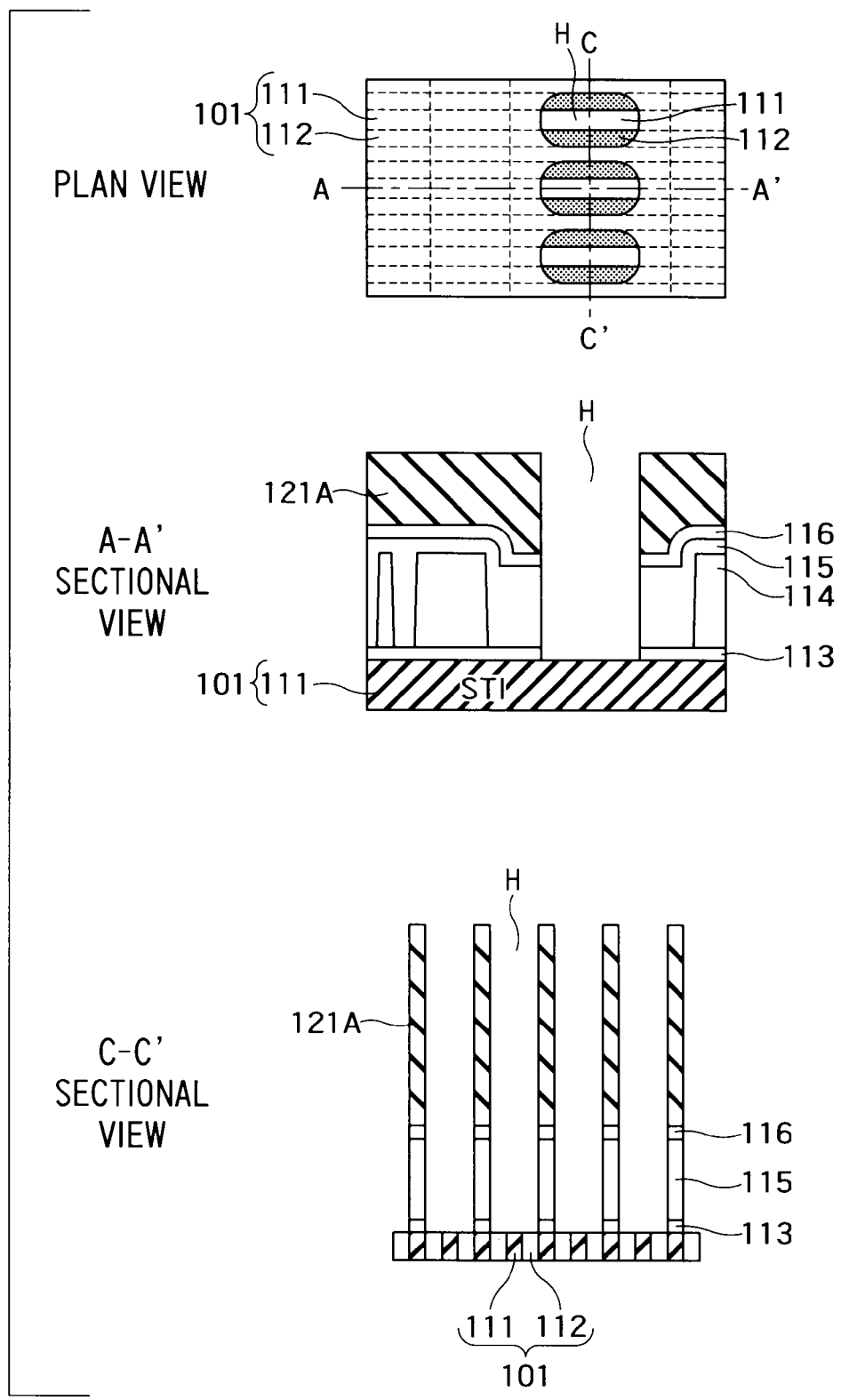

As shown in FIG. 8, the holes H, each of which stretches over the adjacent two active regions 112, are formed in the first inter layer dielectric 121A by RIE (Reactive Ion Etching) using the hard mask pattern. The RIE is performed until the active regions 112 are exposed. Consequently, the substrate 101 (the isolation layers 111 and the active regions 112) is exposed in the holes H. The first inter layer dielectric 121A remains between the holes H to stretch over one isolation layer.

Figure 9:
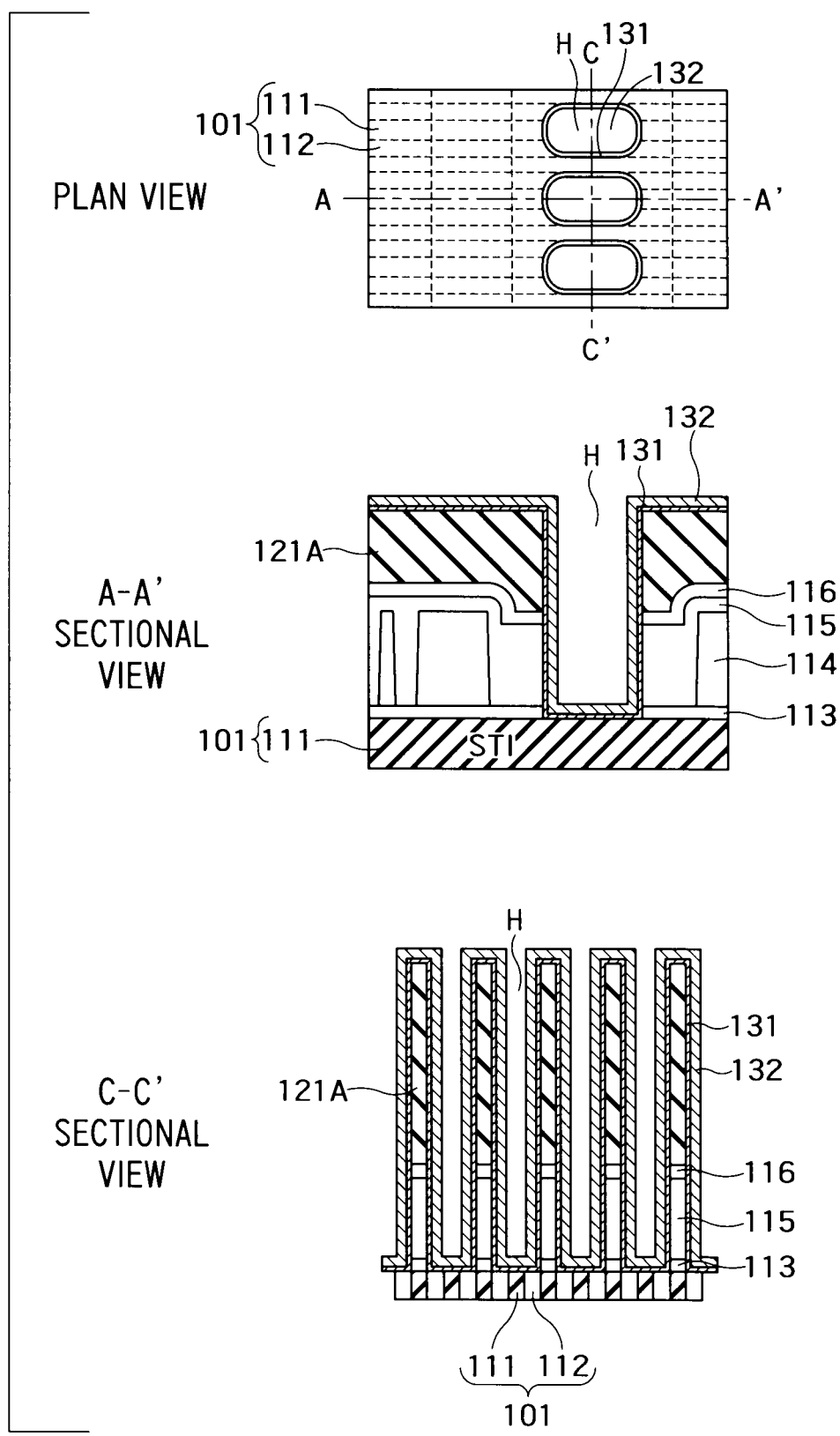

As shown in FIG. 9, the barrier metal layer 131 is deposited on the first inter layer dielectric 121A. Consequently, the barrier metal layer 131 is formed on the bottom and side surfaces of the holes H. The barrier metal layer 131 is, for example, a titanium (Ti) layer or a titanium nitride (TiN) layer.

As shown in FIG. 9, the plug material layer 132 is deposited on the barrier metal layer 131. Consequently, the plug material layer 132 is formed on the bottom and side surfaces of the holes H via the barrier metal layer 131, so that the plug material layer 132 is electrically connected to the active regions 112. In this case, the plug material layer 132 is formed on the bottom and side surfaces of the holes so as not to fill the holes H completely. The plug material layer 132 is, for example, a tungsten (W) layer.

In the present embodiment, the barrier metal layer 131 and the plug material layer 132 are deposited until a total thickness of those layers on the side surfaces of the holes H is substantially equal to the width of one layer of the active regions 112.

Figure 10:
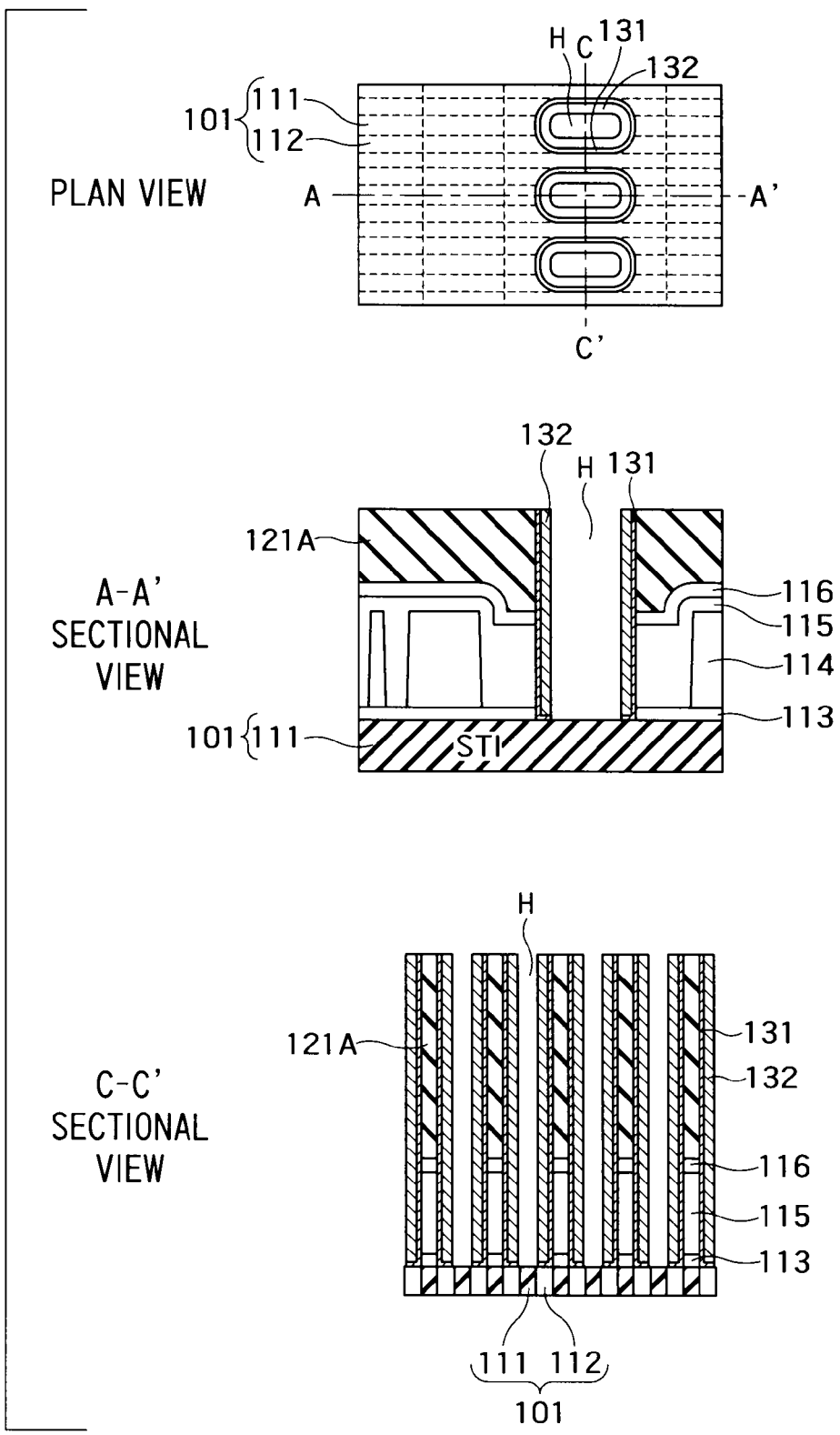

As shown in FIG. 10, anisotropic etching is performed on the barrier metal layer 131 and the plug material layer 132 by RIE. Consequently, the barrier metal layer 131 and the plug material layer 132 formed on the bottom surfaces of the holes H are etched. As a result, as shown in FIG. 10, the barrier metal 131 and the plug material layer 132 remain on the bottom and side surfaces of the holes H in a cylindrical shape as viewed from above the substrate 101. In other words, the planar shape of the barrier metal layer 131 is ring-like as viewed from above the substrate 101, and the planar shape of the plug material layer 132 is also ring-like from above the substrate 101. The plug material layer 132 having a ring shape is formed inside the barrier metal layer 131 having a larger ring shape. By this RIE, the barrier metal layer 131 and the plug material layer 132 remain on the top surfaces of the active regions 112 in the holes H, so that the electrical connection between the active regions 112 and the plug material layer 132 is maintained even after this RIE. Further, the total thickness of the barrier metal layer 131 and the plug material layer 132 is substantially the same as the width of one layer of the active regions 112. As a result, by this RIE, as shown in FIG. 10, the barrier metal layer 131 and the plug material layer 132 are removed from the top surface of the first inter layer dielectric 121A.

Figure 11:
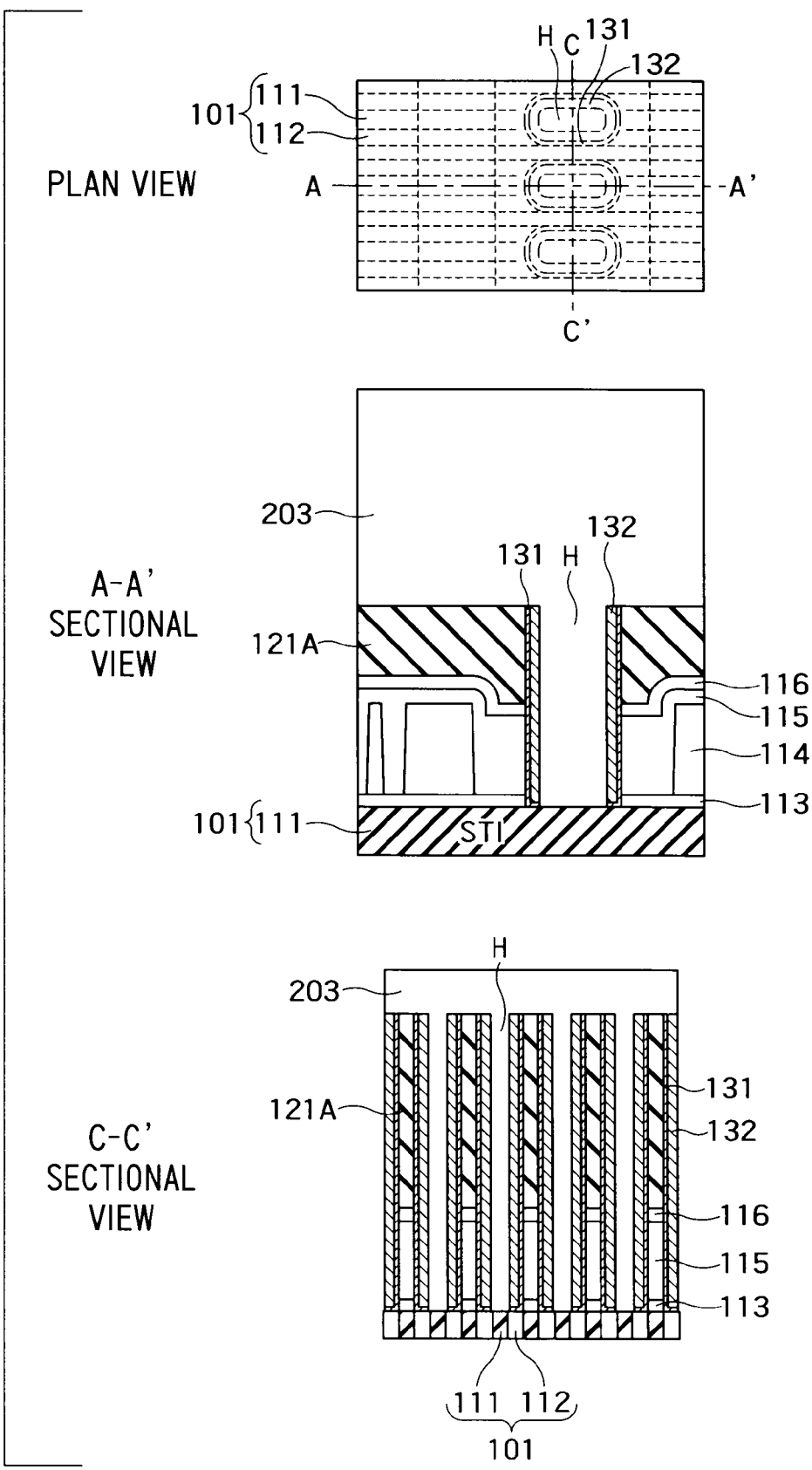
Figure 12:
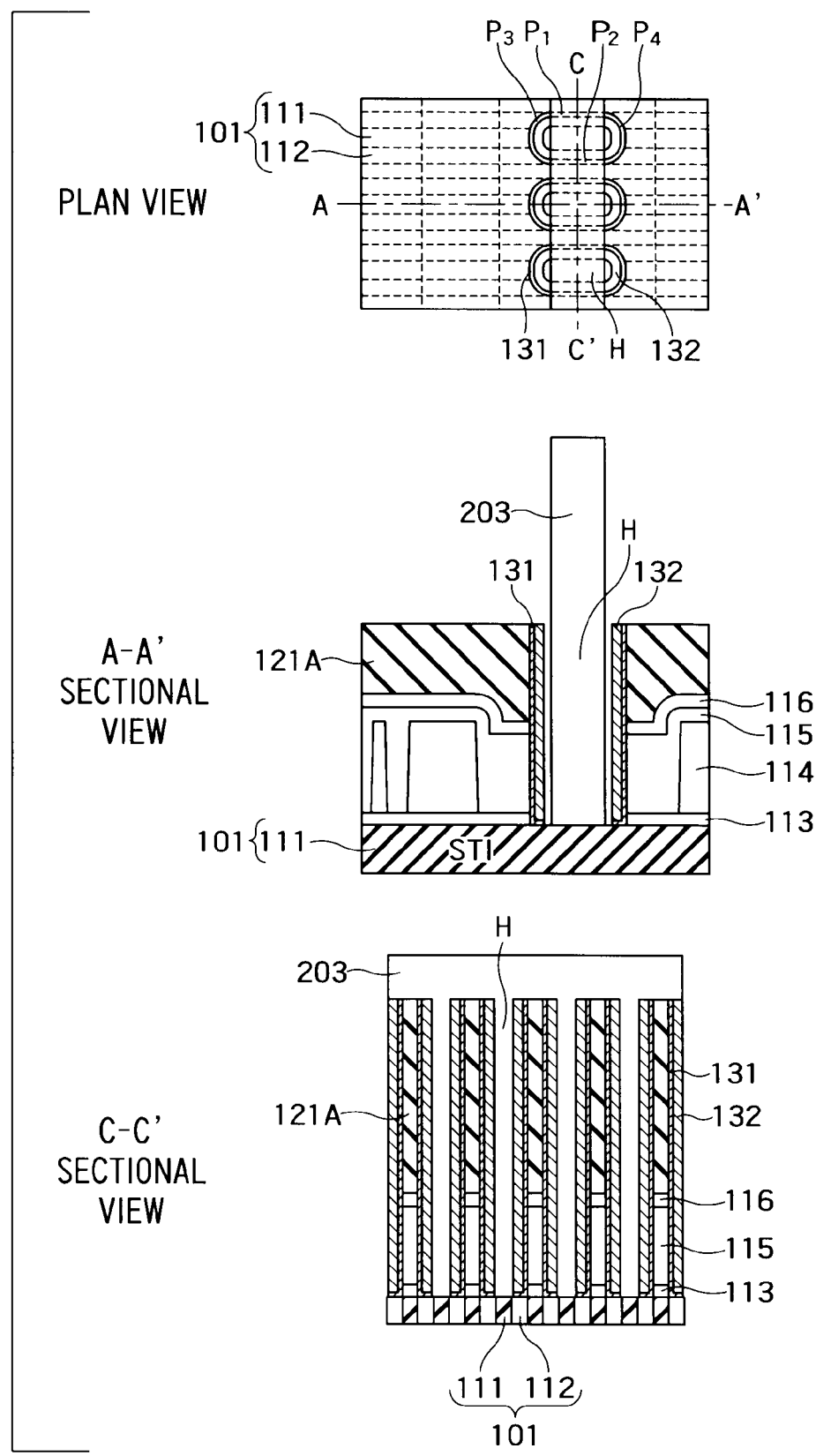

As shown in FIG. 11, a resist layer 203 is formed on the entire surface of the substrate 101. As shown in FIG. 12, the resist layer 203 is patterned. Consequently, a part of the barrier metal layer 131 and the plug material layer 132 remaining in the holes H are covered with the resist layer 203, as shown in FIG. 12.

Hereafter, the shapes of the barrier metal layer 131 and the plug material layer 132 will be described with reference to the plan view in FIG. 12. In FIG. 12, the barrier metal layer 131 and the plug material layer 132 include portions $P_1$ to $P_4$. The portions $P_1$ and $P_2$ are formed on the side surfaces of the hole H which are perpendicular to the line C-C'. The portions $P_1$ and $P_2$ are formed on the active regions 112. Further, the portions $P_3$ and $P_4$ are formed on the remaining side surfaces of the hole H which are not perpendicular to the line C-C'.

In the present embodiment, the holes H are disposed in line along the direction parallel to the line C-C'. Further, the resist layer 203 is patterned into the shape of a belt that extends in the direction parallel to the line C-C' to cover the portions $P_1$ and $P_2$ in each hole H. Therefore, by an RIE process described later, only the portions $P_3$ and $P_4$ are removed of the portions $P_1$ to $P_4$ of the barrier metal layer 131 and the plug material layer 132. It is to be noted that the direction parallel to the C-C' is the above described X-direction.

The resist layer 203 may be slimmed after it is patterned into the belt shape extending parallel to the line C-C' to cover all of $P_1$ to $P_4$, thereby exposing $P_3$ and $P_4$ and covering $P_1$ and $P_2$. By this method, the resist layer 203 can be processed so that it may be shaped to have a small width in the direction parallel to the line A-A'. In other words, the resist layer 203 can be processed into the shape of a belt that has a small belt width.

Figure 13:
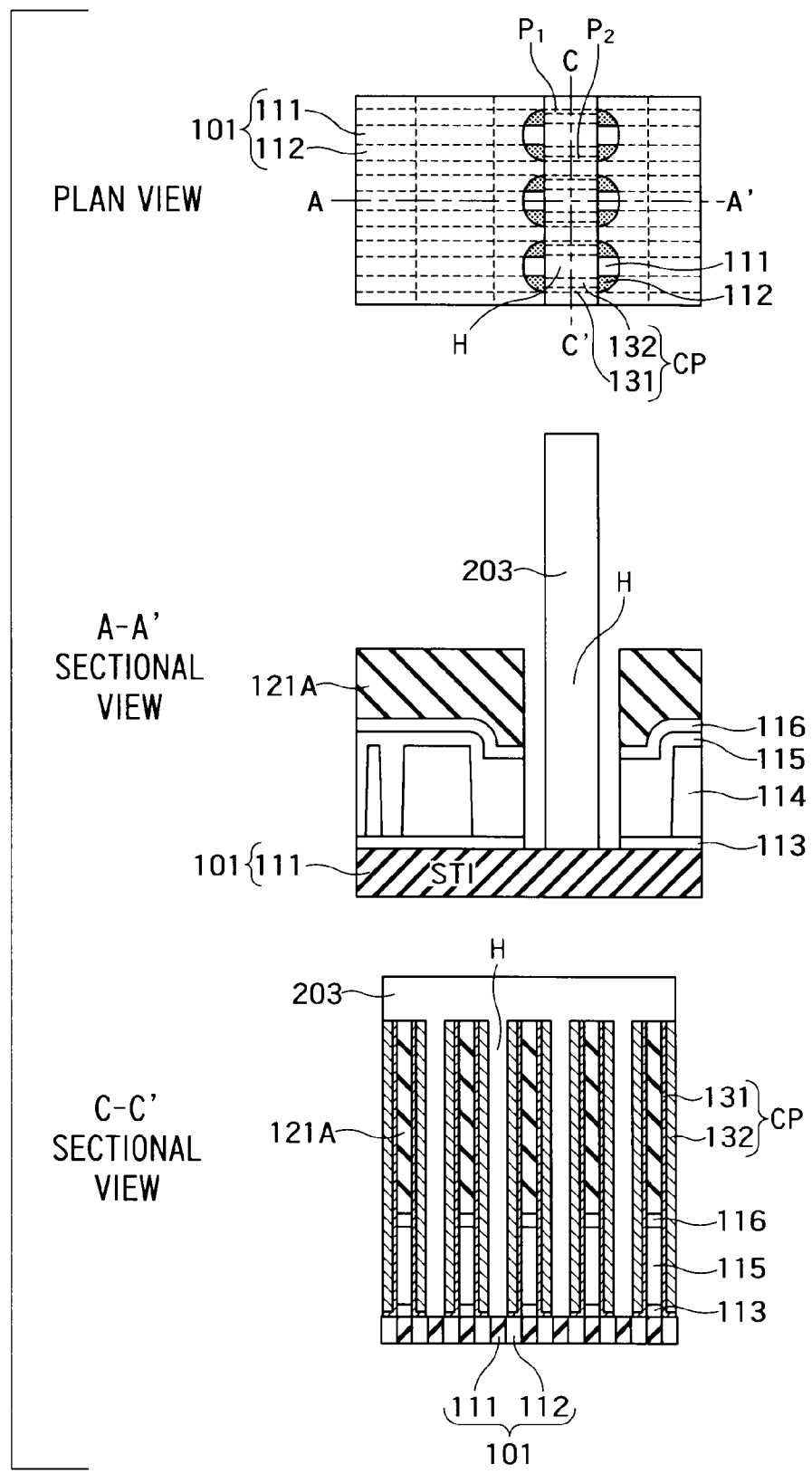

As shown in FIG. 13, the barrier metal layer 131 and the plug material layer 132 are etched by RIE using the resist layer 203. Consequently, regarding the portions $P_1$ to $P_4$ of the barrier metal layer 131 and the plug material layer 132, the portions $P_3$ and $P_4$ are removed, and the portions $P_1$ and $P_2$ are separated from each other. As a result, as shown in FIG. 13, the portions $P_1$ and $P_2$, i.e., the pillar shaped barrier metal layers 131 and plug material layers 132 remain on the bottom and side surfaces of each hole H in a condition where they are separated from each other. As a result, inside each hole H, the barrier metal layers 131 and the plug material layers 132 remain on the bottom surface of the hole H and on both side surfaces of the hole H which are perpendicular to the line C-C'.

According to the RIE process, two pillar-shaped contact plugs CP are formed in each hole H, where each of the contact plugs CP includes the barrier metal layer 131 and the plug material layer 132. In each hole H, one of those contact plugs CP is formed on one of the active regions 112, and the other contact plug CP is formed on the other active region 112. In such a manner, through this RIE process, such a structure is realized that one contact plug CP is electrically connected to each active region 112.

Figure 14:
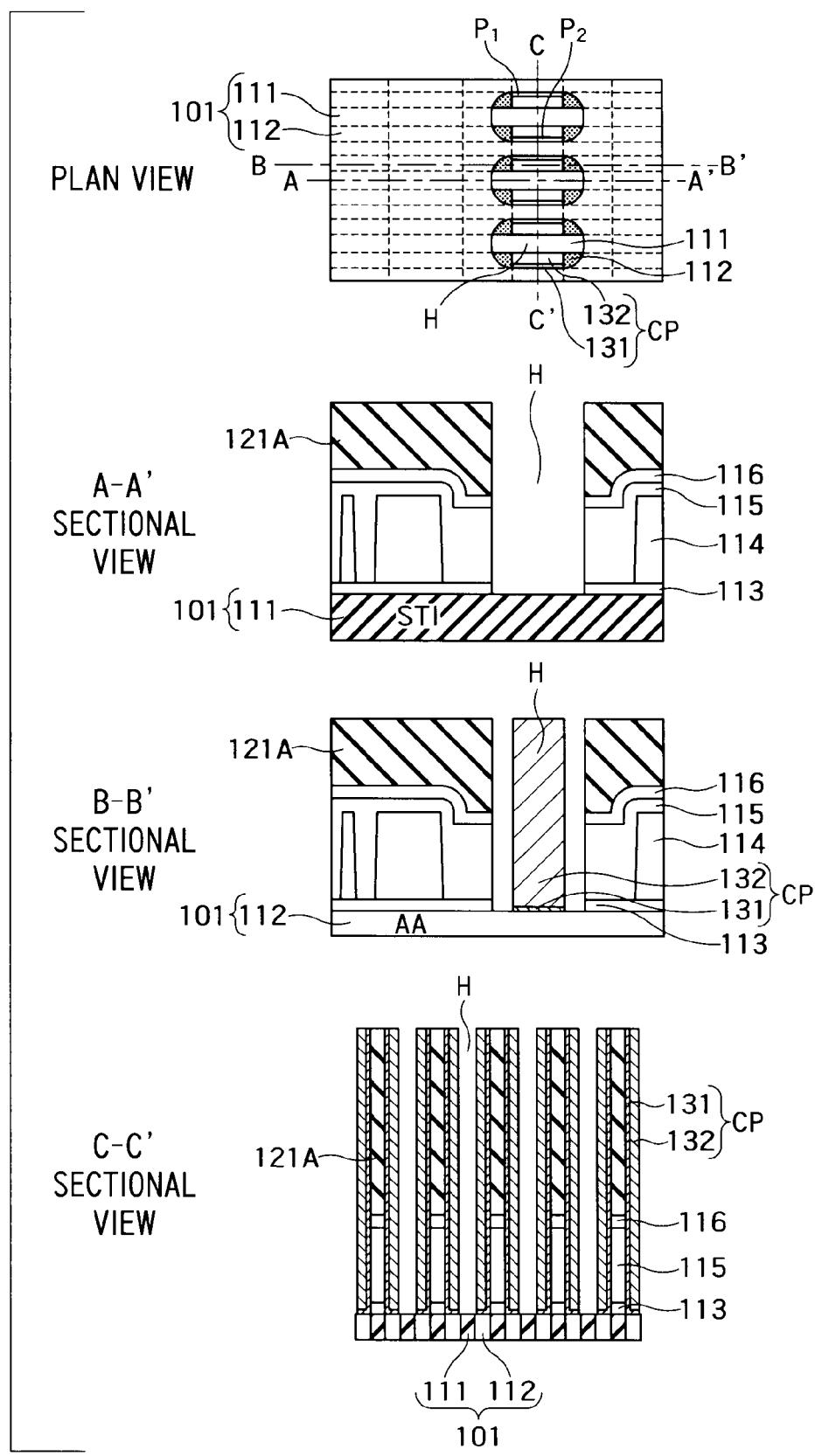

As shown in FIG. 14, the resist layer 203 is removed. In such a manner, in the present embodiment, the contact plugs CP are formed in each hole H by the processes shown in FIGS. 7 to 14. However, each hole H still has a cavity.

Figure 15:
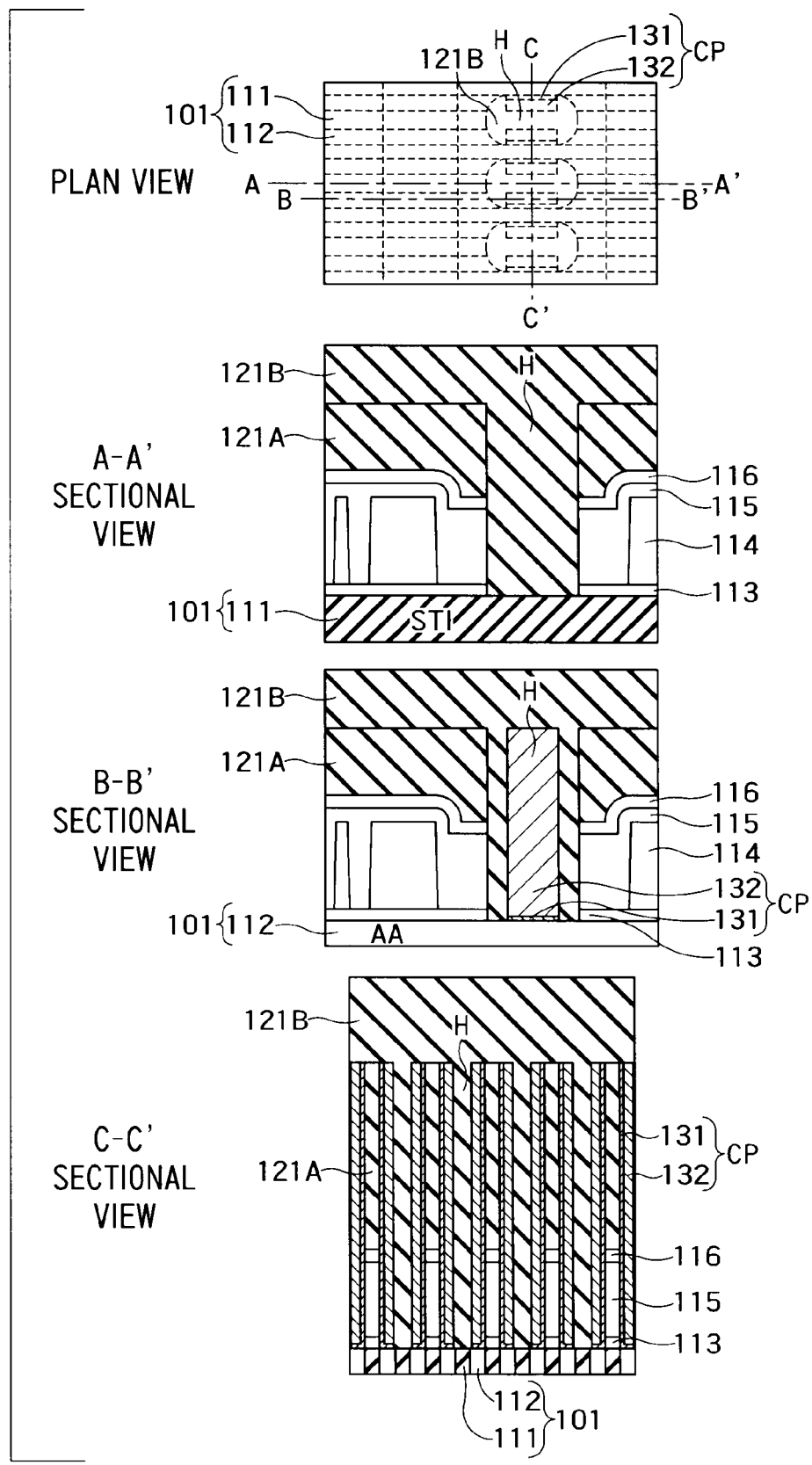
Figure 16:
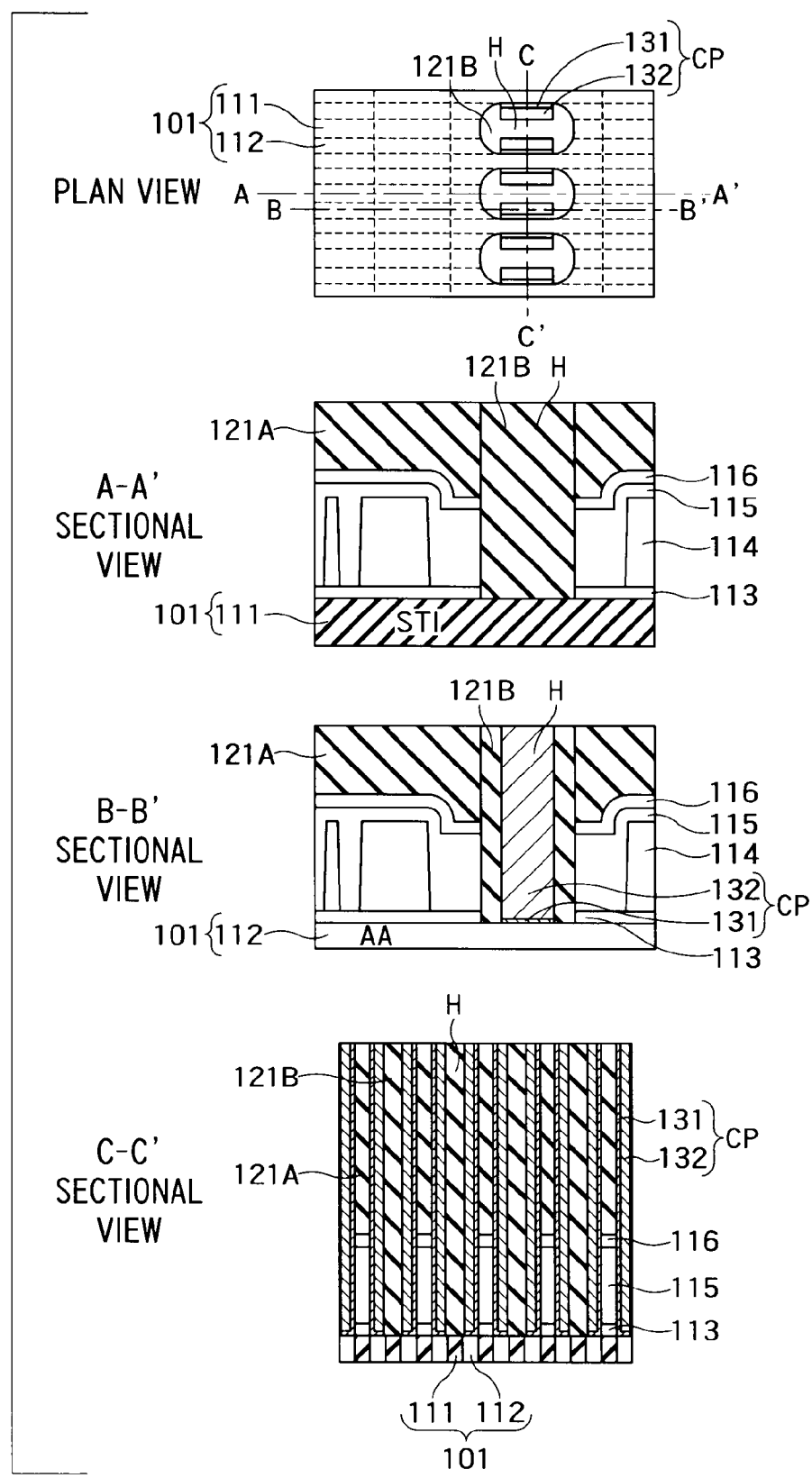

Therefore, in the present embodiment, a second inter layer dielectric 121B is deposited on the entire surface of the substrate 101 (FIG. 15). The second inter layer dielectric 121B is planarized by CMP (Chemical Mechanical Polishing) (FIG. 16). Consequently, the second inter layer dielectric 121B is buried in the cavity. The second inter layer dielectric 121B is, for example, a silicon oxide layer.

Figure 17:
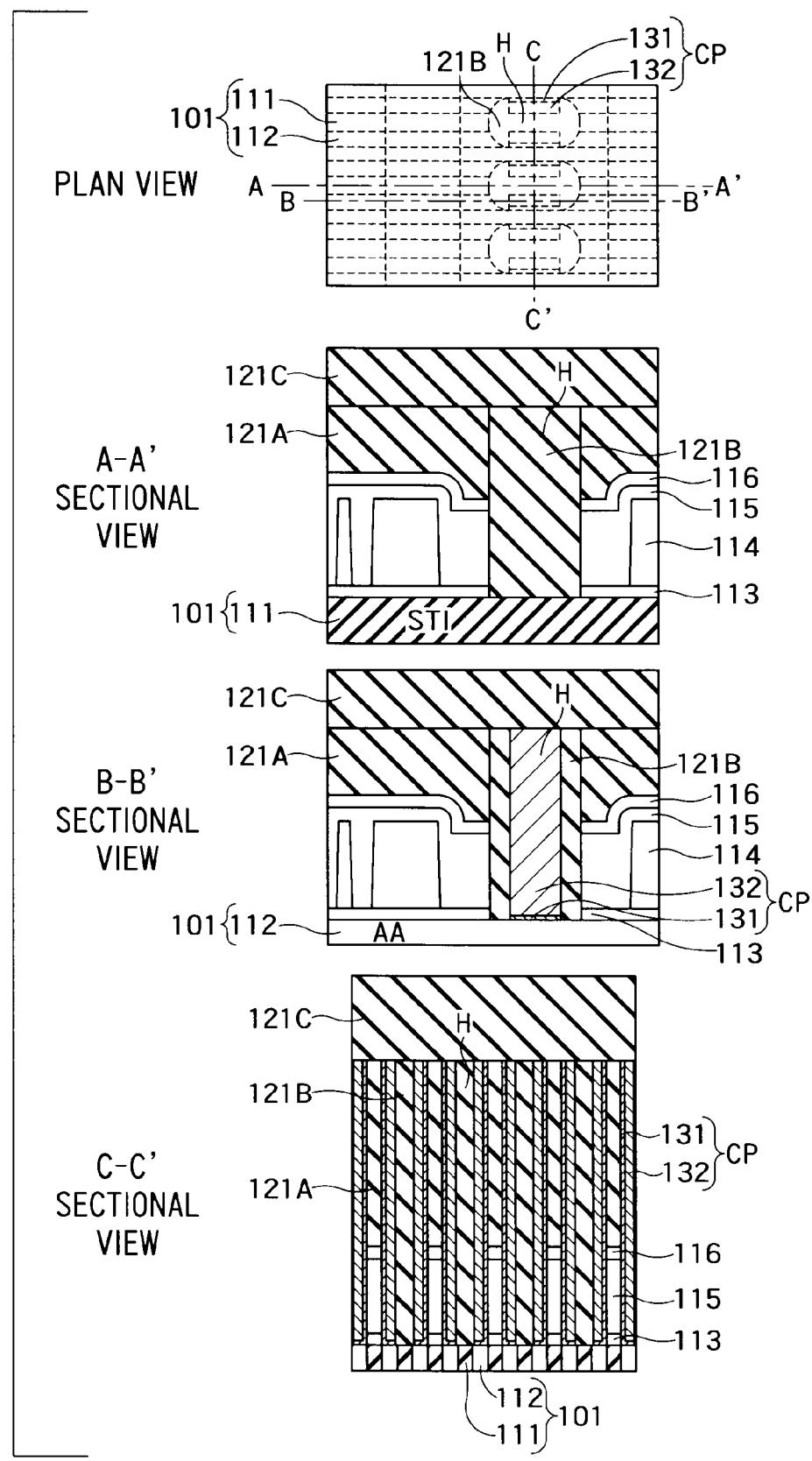
Figure 18:
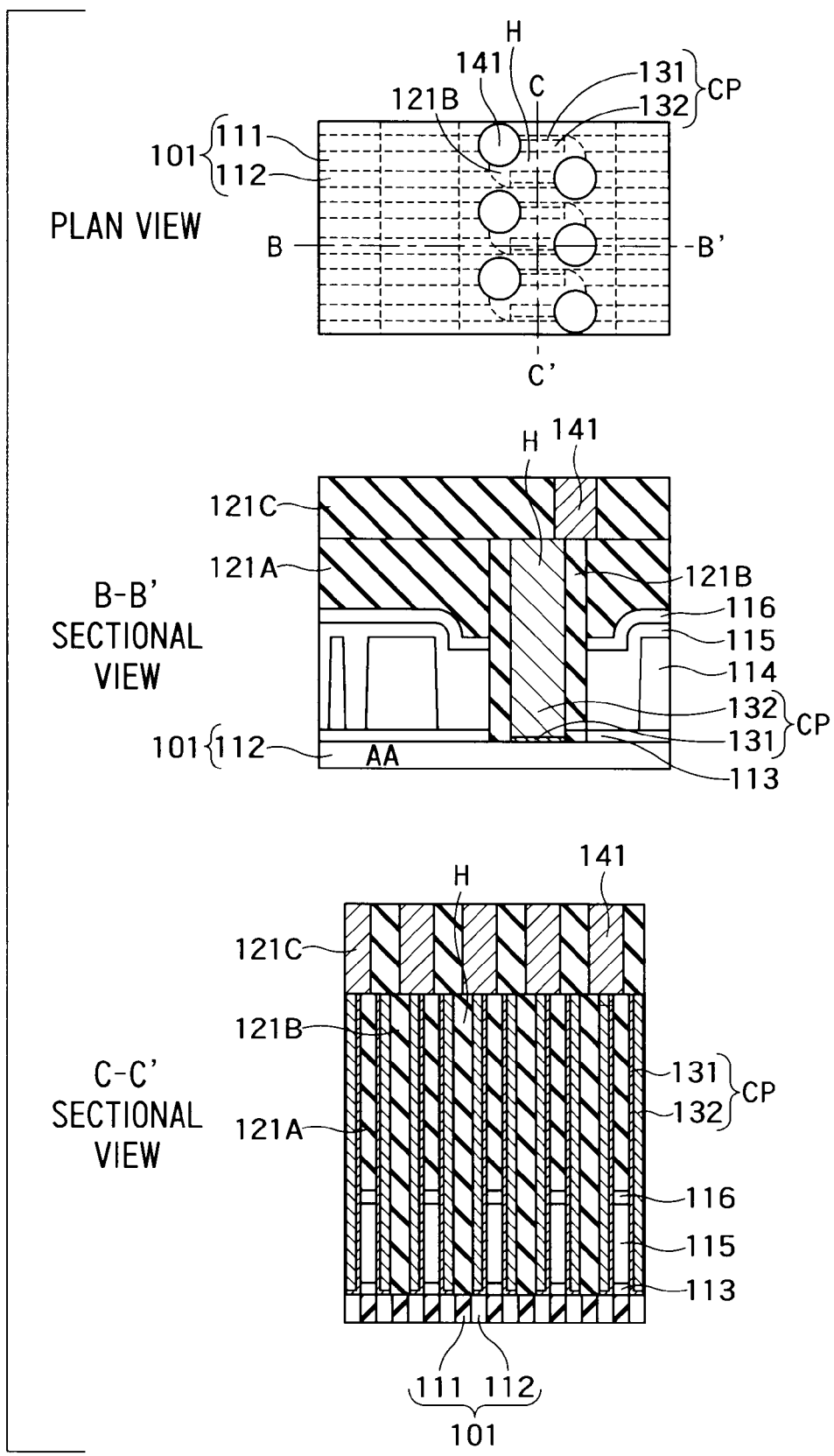

As shown in FIG. 17, a third inter layer dielectric 121C is deposited on the entire surface of the substrate 101. As shown in FIG. 18, trenches for interconnects are formed in the third inter layer dielectric 121C, to expose the contact plugs CP in them. As shown in FIG. 18, interconnect layers 141 are buried in the trenches. Consequently, each of the interconnect layers 141 is electrically connected to a contact plug CP.

In the present embodiment, as shown in FIG. 18, the interconnect layers 141 can be alternately arranged on the end portions on the portion $P_1$ side and the end portions on the portion $P_2$ side of the contact plugs CP (i.e., arranged in a zigzag alignment). Consequently, in the present embodiment, the interconnect layers 141 adjacent to each other in the X-direction can be more spaced from each other, so that they can be effectively prevented from short-circuiting to each other. The interconnect layers 141 shown in FIG. 18 are disposed in the zigzag alignment along the direction parallel to the line C-C' as viewed from above the substrate 101.

In such a manner, the semiconductor device in FIG. 1 is manufactured. According to the manufacturing method in the present embodiment, the contact processing can be performed in a larger margin of openings in lithography than the conventional methods. Further, in the present embodiment, the contact area between an active region 112 and a contact plug CP can be increased by elongating the contact plug CP in the Y-direction (see FIG. 2). Accordingly, in the present embodiment, it is possible to improve the yield of the semiconductor device.

Hereafter, a description will be given of modifications of the manufacturing method shown in FIGS. 7 to 18.

In the manufacturing method shown in FIGS. 7 to 18, when removing the portions $P_3$ and $P_4$ of the portions $P_1$ to $P_4$, the resist layer 203 is formed on the entire surface of the substrate 101 (FIG. 11) and patterned (FIG. 12). Then, the barrier metal layer 131 and the plug material layer 132 are etched by RIE using the resist layer 203 (FIG. 13), and the resist layer 203 is then removed (FIG. 14).

However, in the manufacturing method shown in FIGS. 7 to 18, there is a possibility that the resist layer 203 may topple down after the process shown in FIG. 12. This is because the resist layer 203 takes on a narrow and high shape. Therefore, the processes shown in FIGS. 11 to 14 may be replaced with the following processes shown in FIGS. 19 and 20.

Figure 19:
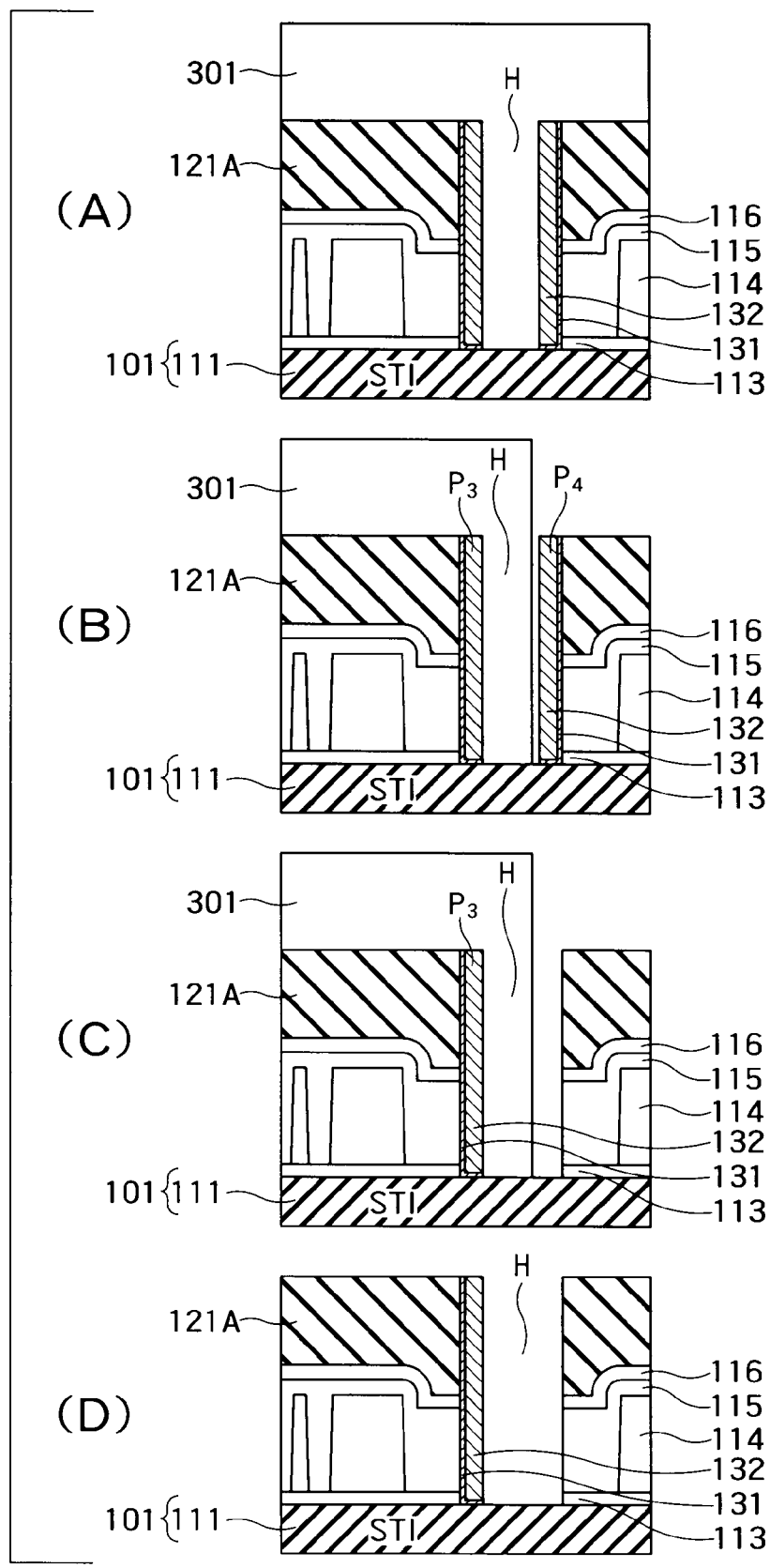
FIGS. 19 and 20 illustrate side sectional views showing a modification of the processes shown in FIGS. 11 to 14.
Figure 20:
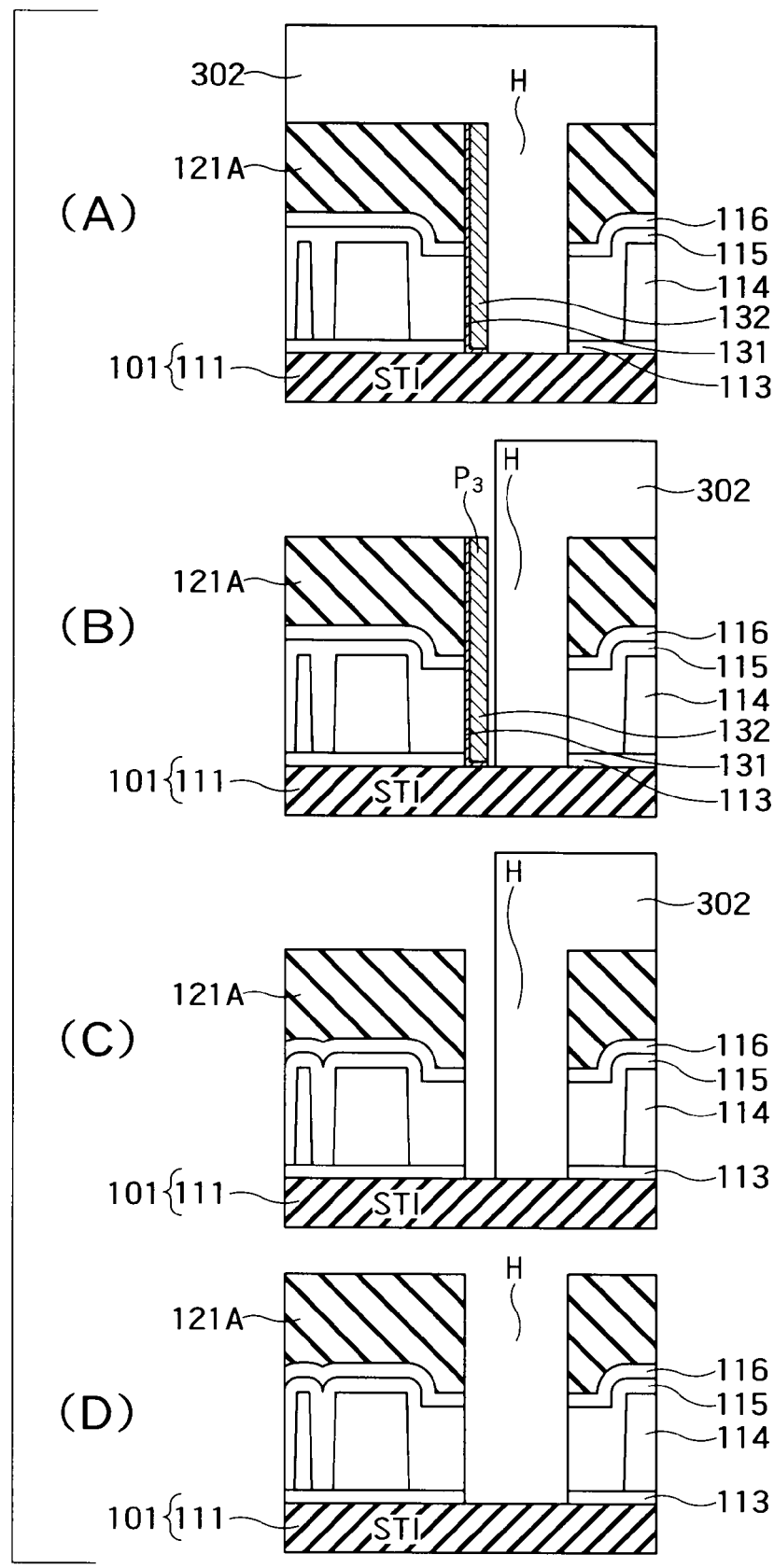

FIGS. 19 and 20 illustrate side sectional views showing a modification of the processes shown in FIGS. 11 to 14. Each of the sectional views shown in FIGS. 19 and 20 is taken along the line A-A'.

As shown in FIG. 19(A), a resist layer 301 is formed on the entire surface of the substrate 101. As shown in FIG. 19(B), the resist layer 301 is patterned. FIG. 19(B) shows the above described portions $P_3$ and $P_4$. In the patterning in FIG. 19(B), the portions $P_1$ and $P_3$ of the portions $P_1$ to $P_4$ of the barrier metal layer 131 and the plug material layer 132 are covered with the resist layer 301. Since this patterning allows the resist layer 301 to remain also on the portion $P_3$, the resist layer 301 can have a larger width than that between the portions $P_3$ and $P_4$.

As shown in FIG. 19(C), the barrier metal layer 131 and the plug material layer 132 are etched by RIE using the resist layer 301. Consequently, the portion $P_4$ of the portions $P_1$ to $P_4$ is removed. As a result, as viewed from above the substrate 101, the barrier metal layer 131 and the plug material layer 132 remain in a U-shape. As shown in FIG. 19(D), the resist layer 301 is removed.

As shown in FIG. 20(A), a resist layer 302 is formed on the entire surface of the substrate 101. As shown in FIG. 20(B), the resist layer 302 is patterned. FIG. 20(B) shows the above described portions $P_3$. In the patterning in FIG. 20(B), the portions $P_1$ to $P_2$ of the portions $P_1$ to $P_3$ of the barrier metal layer 131 and the plug material layer 132 are covered with the resist layer 302. Since this patterning allows the resist layer 302 to remain also in a region in which the portion $P_4$ used to exist, the resist layer 302 can have a larger width than that between the portions $P_3$ and $P_4$.

As shown in FIG. 20(C), the barrier metal layer 131 and the plug material layer 132 are etched by RIE using the resist layer 302. Consequently, the portion $P_3$ of the portions $P_1$ to $P_3$ is removed. As a result, the portions $P_1$ and $P_2$ are separated from each other. As shown in FIG. 20(D), the resist layer 302 is removed.

In the process in FIG. 19(B), it is possible to pattern the resist layer 301 in such a manner that the resist layer 301 may have a large width. Similarly, in the process in FIG. 20(B), it is possible to pattern the resist layer 302 in such a manner that the resist layer 302 may have a large width. Therefore, in these modifications, it is possible to prevent the resist layers 301 and 302 from toppling down by increasing the widths of the resist layers 301 and 302.

The resist layer 301 is an example of a first resist layer of the present invention, and the resist layer 302 is an example of the second resist layer of the present invention.

Hereafter, a description will be given of first to third modifications of the configuration shown in FIG. 1.

Figure 21:
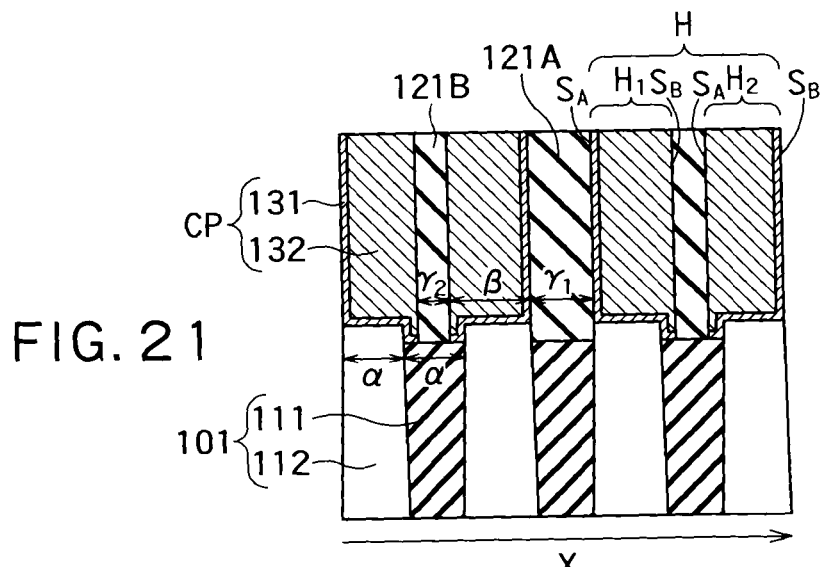
FIG. 21 is a side sectional view showing a first modification of the configuration shown in FIG. 1.

FIG. 21 is a side sectional view showing the first modification of the configuration shown in FIG. 1.

In FIG. 21, a height of the top surfaces of the active regions 112 is higher than a height of the top surfaces of the isolation layers 111. This holds true also in FIG. 1.

In FIG. 21, the X-directional width of each of the isolation layers 111 and the active regions 112 is indicated by $\alpha$. Further, the X-directional total width of a barrier metal layer 131 and a plug material layer 132, i.e., the X-directional width of a contact plug CP is indicated by $\beta$. Further, the X-directional width of the first inter layer dielectric 121A is indicated by $\gamma 1$, and that of the second inter layer dielectric 121B is indicated by $\gamma 2$.

In the present modification, the width $\beta$ of the contact plug CP is larger than the width $\alpha$. Further, in the present modification, the hole H has a width that stretches over one isolation layer and two diffusion layers, similarly to FIG. 1. As a result, in the present modification, the width $\gamma 1$ of the first inter layer dielectric 121A is substantially equal to the width $\alpha$, and the width $\gamma 2$ of the second inter layer dielectric 121B is smaller than the width a ($\gamma 1 \equiv \alpha$, $\gamma 2 < \alpha$).

As a result, the barrier metal layers 131 and the plug material layers 132 are formed on the side surfaces of the holes $H_1$ and $H_2$ perpendicular to the X-direction, the top surfaces of the active regions 112, the side surfaces of the active regions 112, and the top surfaces of the isolation layers 111. This has an effect of increasing the area of contact between a contact plug CP and an active region 112, thereby decreasing the contact resistance.

In the present modification, not only the width $\gamma 2$ but also the width $\gamma 1$ may be different from the width $\alpha$. The width $\beta$ is the X-directional width of each contact plug CP, whereas each of the widths $\gamma 1$ and $\gamma 2$ is the X-directional width between the contact plugs CP. In such a manner, in the present modification, both of the widths γ1 and γ2 may be different from the width α. Similarly, the width β of each contact plug CP may also be different from the width α. A specific modification in which the width γ1 is different from the width α will be described later.

It is to be noted that in FIG. 1, the width β is substantially equal to the width α, and each hole H has a width that stretches over one isolation layer and two diffusion layers, so that the widths γ1 and γ2 are both substantially equal to the width α (γ1≅γ2≅α).

Figure 22:
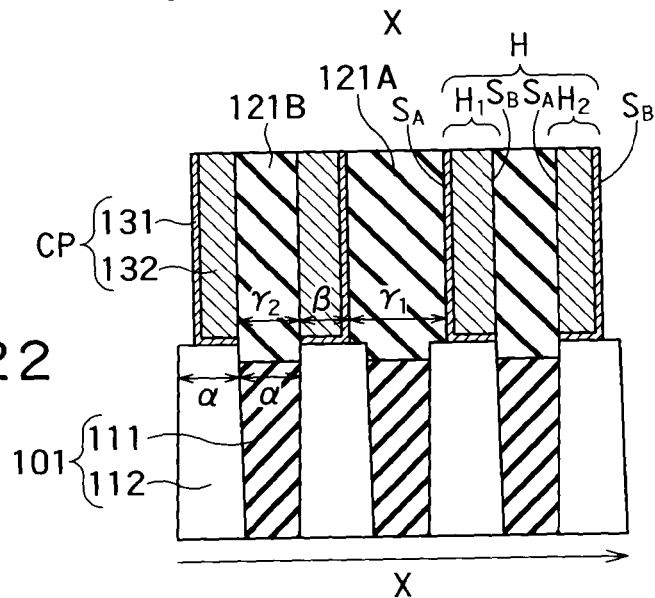
FIG. 22 is a side sectional view showing a second modification of the configuration shown in FIG. 1.

FIG. 22 is a side sectional view showing the second modification of the configuration shown in FIG. 1.

In FIG. 22, each hole H has a smaller width than that in FIG. 21. As a result, the width γ1 is larger than the width α (γ1>α). On the other hand, the width γ2 is substantially equal to the width α (γ2≅α). As a result, the total width β of the barrier metal layer 131 and the plug material layer 132 is smaller than the width α.

In such a manner, in the second modification, the width γ1 is larger than the width α, so that a possibility of the short-circuiting between the adjacent contact plugs CP through the first inter layer dielectric 121A between the holes H is reduced.

Figure 23:
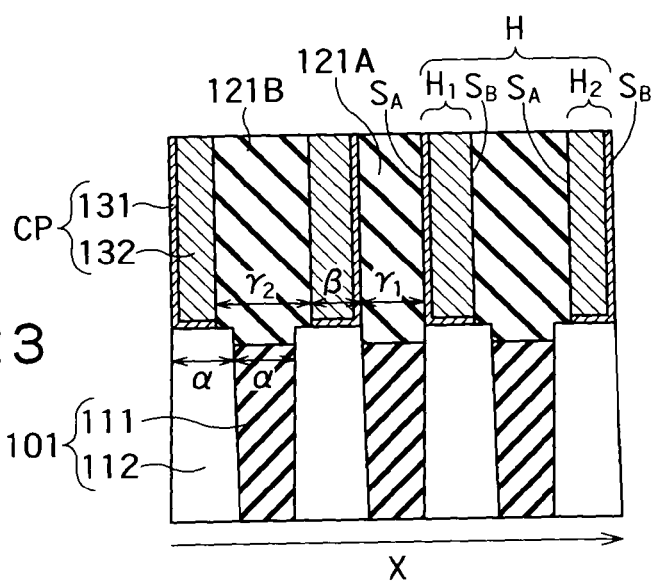
FIG. 23 is a side sectional view showing a third modification of the configuration shown in FIG. 1.

FIG. 23 is a side sectional view showing the third modification of the configuration shown in FIG. 1.

In FIG. 23, each hole H has substantially the same width as that in FIG. 21. As a result, the width γ1 is substantially equal to the width α (γ1≅α). On the other hand, the total width β of the barrier metal layer 131 and the plug material layer 132 is smaller than the width α. As a result, the γ2 is larger than the width α (γ2>α).

In such a manner, in the third modification, the width γ2 is larger than the width α, so that a possibility of the short-circuiting between the adjacent contact plugs CP which face each other via the second inter layer dielectric 121B is reduced.

In FIGS. 21 to 23, the side surfaces $S_A$ and $S_B$ of the holes $H_1$ and $H_2$ are shown. In FIG. 21, each of the side surfaces $S_A$ and $S_B$ of the holes $H_1$ and $H_2$ is positioned on a border between an isolation layer 111 and an active region 112. On the other hand, in FIG. 22, the side surface $S_A$ of the hole $H_1$ and the side surface $S_B$ of the hole $H_2$ are positioned not on the borders but on the active regions 112. Further, in FIG. 23, the side surface $S_B$ of the hole $H_1$ and the side surface $S_A$ of the hole $H_2$ are positioned not on the borders but on the active regions 112.

Further, in the present embodiment, a structure that combines the second and third modifications may be employed. In other words, the width γ1 may be set larger than the width α, and the width γ2 may be set larger than the width α. In this case, each of the side surfaces $S_A$ and $S_B$ of the holes $H_1$ and $H_2$ is positioned not on a border between an isolation layer 111 and an active region 112 but on an active region 112.

As described above, in the semiconductor device of the present embodiment, the barrier metal layer 131 is formed on the bottom surface of the hole $H_N$ and on one of two side surfaces of the hole $H_N$ perpendicular to the X-direction. Consequently, in the present embodiment, it is possible to relatively reduce the percentage of the barrier metal layer 131 that occupies the cross section of the contact plug CP. Therefore, in the present embodiment, for example, the resistivity of the contact plug CP decreases.

Further, in the present embodiment, the barrier metal layer 131 and the plug material layer 132 are formed by the above described sidewall formation process. Therefore, according to the present embodiment, the contact processing in a lithographic size of a relatively large opening margin can be performed. Accordingly, in the present embodiment, the level of difficulty in contact process is reduced.

In the following, a second embodiment of the present invention will be described. Since the second embodiment is a modification of the first embodiment, differences from the first embodiment are mainly described in the following.

Second Embodiment

Figure 24:
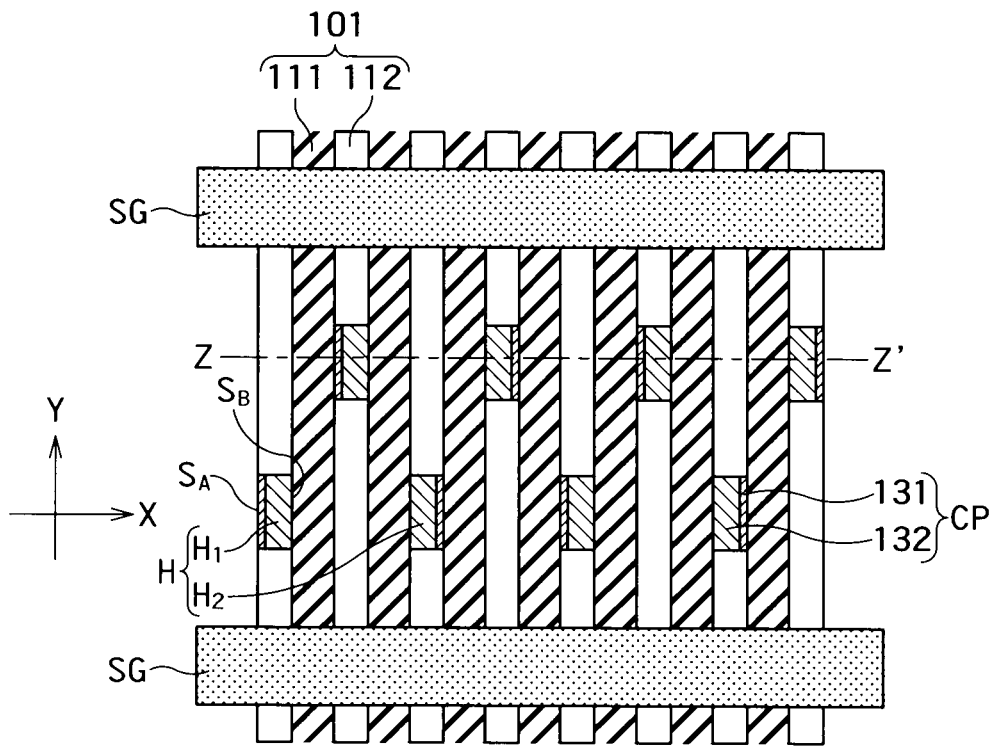
FIG. 24 is a plan view showing a configuration of a semiconductor device of a second embodiment.

FIG. 24 is a plan view showing a configuration of a semiconductor device of the second embodiment.

In the first embodiment, as shown in FIG. 2, the contact plugs CP have been arranged in line along the X-direction as viewed from above the substrate 101. In contrast, in the second embodiment, as shown in FIG. 24, the contact plugs CP are disposed in a zigzag alignment along the X-direction as viewed from above the substrate 101.

Figure 25:
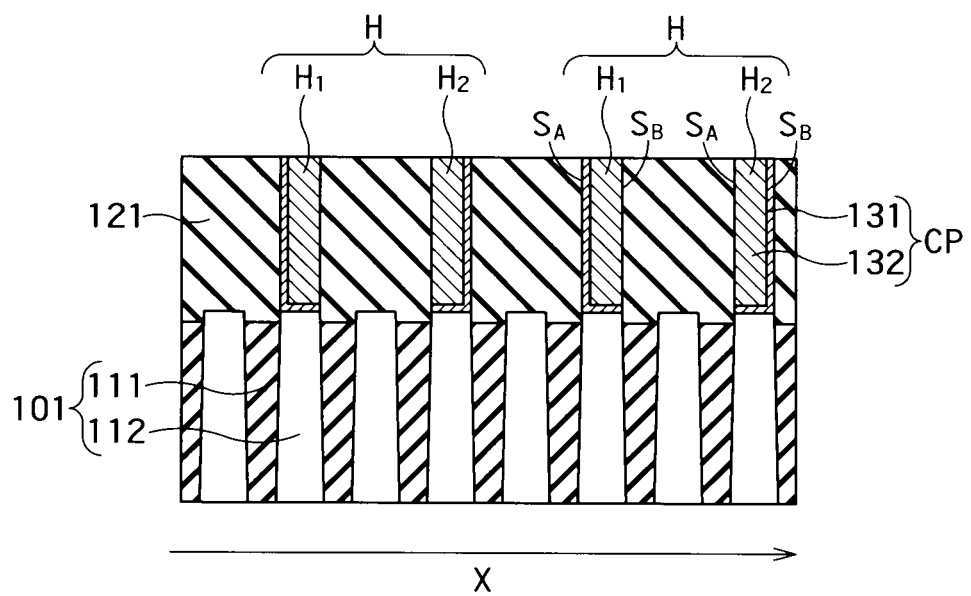
FIG. 25 is a side sectional view showing the configuration of the semiconductor device in FIG. 24.

FIG. 25 is a side sectional view showing the configuration of the semiconductor device in FIG. 24. The side sectional view in FIG. 25 is taken along a line Z-Z' in FIG. 24.

In the first embodiment, as shown in FIG. 1, the inter layer dielectric 121 that stretches over one isolation layer is interposed between a pair of holes $H_1$ and $H_2$. Further, the inter layer dielectric 121 that stretches over one isolation layer is also interposed between holes $H_1$ and $H_2$ which belong different pairs.

On the other hand, in the second embodiment, as shown in FIG. 25, the inter layer dielectric 121 that stretches over two isolation layers and one active region is interposed between a pair of holes $H_1$ and $H_2$. Further, the inter layer dielectric 121 that stretches over two isolation layers and one active region is also interposed between holes $H_1$ and $H_2$ which belong different pairs.

Therefore, in the second embodiment, similarly to the first modification, the possibility that a hole is formed in the inter layer dielectric 121 between the holes $H_1$ and $H_2$ belonging different pairs is reduced. Moreover, in the second embodiment, similarly to the second modification, the possibility of the short-circuiting between the contact plugs CP belonging the same pair is reduced.

Now, the first embodiment has an advantage in that the distance between the select gates SG (FIG. 2) can be reduced, thereby making a semiconductor device smaller.

Figure 26:
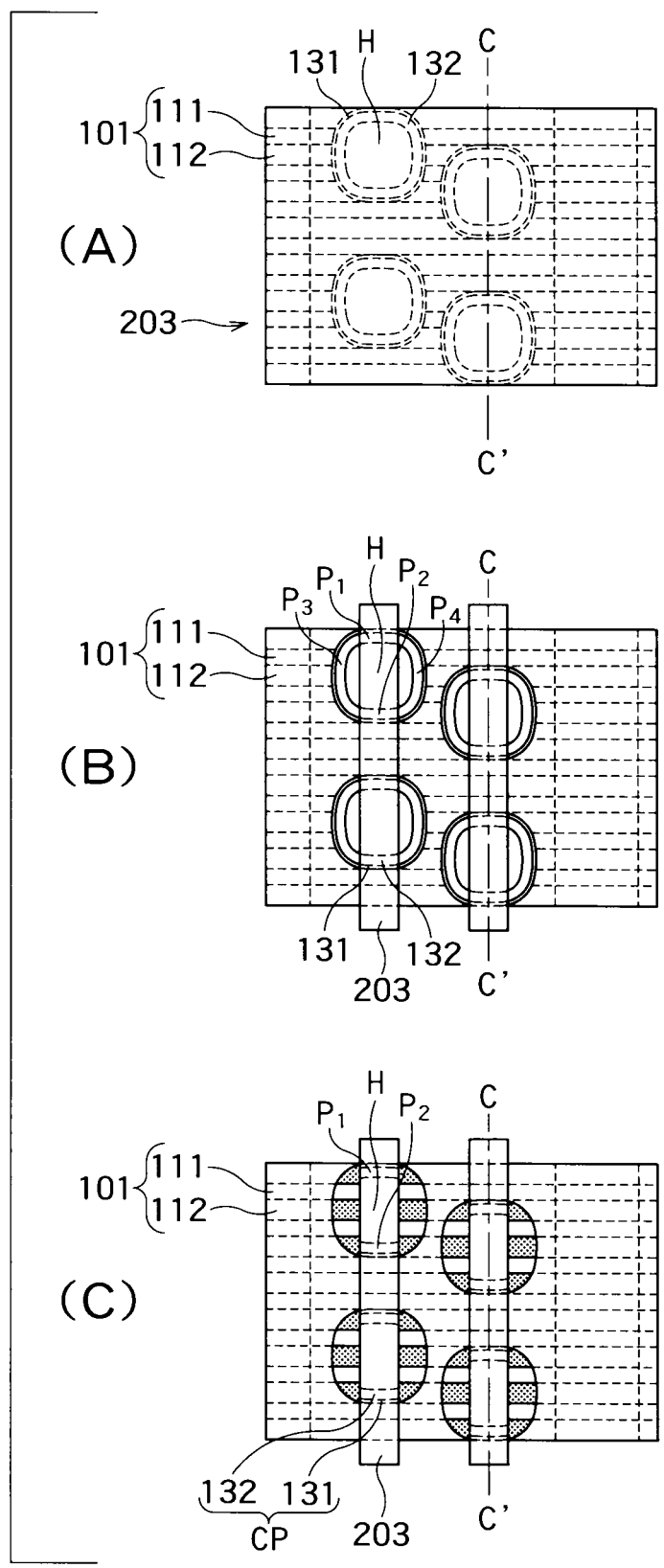
FIGS. 26 and 27 show plan views for illustrating a method of manufacturing the semiconductor device in FIG. 24.
Figure 27:
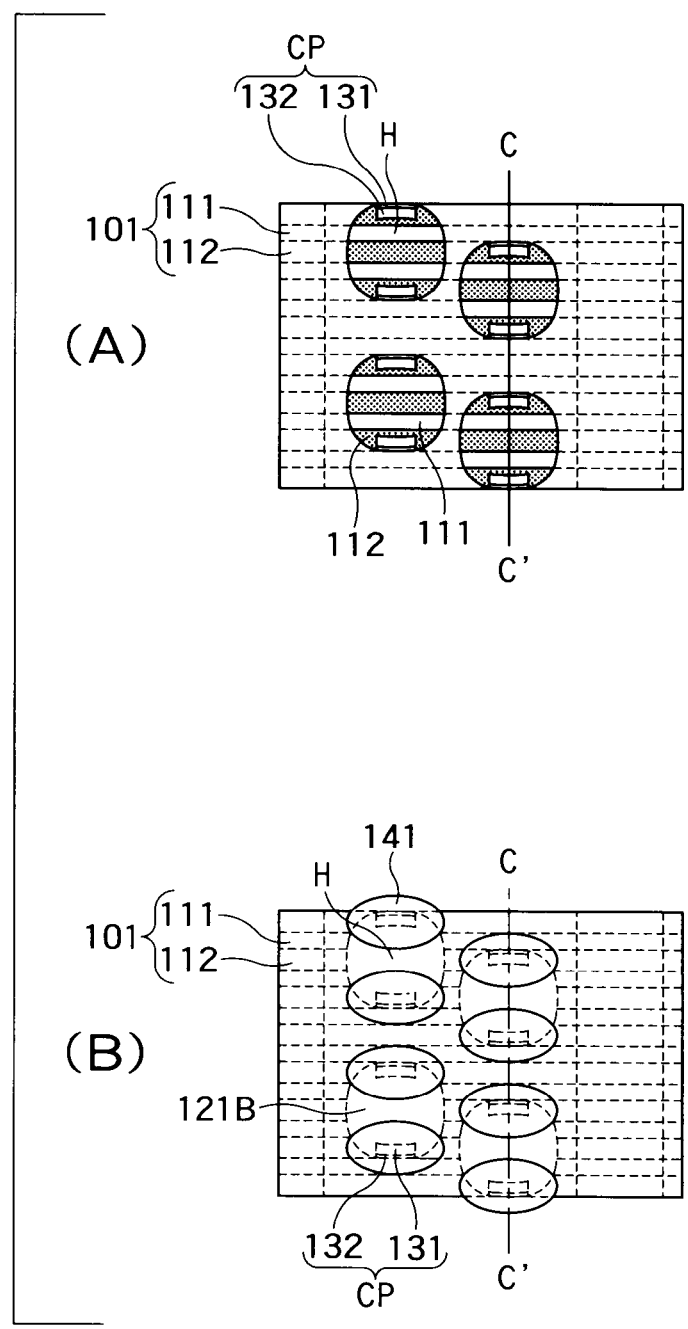

Hereafter, a description will be given of a method of manufacturing the semiconductor device in FIG. 24. FIGS. 26 and 27 show plan views for illustrating the method of manufacturing the semiconductor device in FIG. 24.

Similarly to the first embodiment, processes of FIGS. 7 to 10 are performed. However, the holes H are disposed in line along the X-direction as viewed from above the substrate 101 in the first embodiment, while the holes H are disposed in a zigzag alignment along the X-direction as viewed from above the substrate 101 in the second embodiment.

As shown in FIG. 26(A), a resist layer 203 is formed on the entire surface of the substrate 101. As shown in FIG. 26(B), the resist layer 203 is patterned. In FIG. 26(B), portions $P_1$ to $P_4$ of the barrier metal layers 131 and plug material layers 132 are shown. In the second embodiment, the resist layer 203 is patterned into a shape of two belts extending in a direction parallel to line C-C' to cover the portions $P_1$ and $P_2$ in each hole H. The direction parallel to the line C-C' corresponds to the X-direction.

As shown in FIG. 26(C), the barrier metal layer 131 and the plug material layer 132 are etched by RIE using the resist layer 203. Consequently, regarding the portions $P_1$ to $P_4$ of the barrier metal layers 131 and the plug material layers 132, the portions $P_3$ and $P_4$ are removed, and the portions $P_1$ and $P_2$ are separated from each other. As a result, as shown in FIG. 26(C), the portions $P_1$ and $P_2$, i.e., the pillar shaped barrier metal layers 131 and plug material layers 132 remain on the bottom and side surfaces of the holes H in a condition where they are separated from each other. According to the present RIE process, two pillar shaped contact plugs CP are formed in each hole H, where each of the contact plugs CP including a barrier metal layer 131 and a plug material layer 132.

As shown in FIG. 27(A), the resist layer 203 is removed. In this way, in the second embodiment, the contact plugs CP are formed in the holes H by the processes shown in FIGS. 7 to 10 and FIGS. 26(A) to 27(A).

Hereafter, in the second embodiment, similarly to the first embodiment, the processes shown in FIGS. 15 to 18 are performed. Consequently, a structure shown in FIG. 27(B) is realized. FIG. 27(B) shows the interconnect layer 141s, similarly to FIG. 18.

In the second embodiment, the distance between the contact plugs CP adjacent in the direction parallel to the line C-C' is longer than that in the first embodiment. Therefore, in the second embodiment, it is possible to increase the area of each interconnect layer 141.

The interconnect layers 141 are, for example, intermediate interconnect layers formed between the contact plugs CP and via plugs. The second embodiment is effective, for example, in a case of forming such intermediate interconnect layers. This is because the intermediate interconnect layers can have larger areas according to the second embodiment, thereby reducing the difficulties in processing of the intermediate interconnect layers.

As described above, in the present embodiment, the contact plugs CP are arranged in a zigzag alignment along the X-direction as viewed from above the substrate 101. Accordingly, in the present embodiment, the possibility that a hole is formed in the inter layer dielectric 121 between the holes $H_1$ and $H_2$ belonging different pairs is reduced. Further, the possibility of the short-circuiting between a pair of the contact plugs CP is reduced. Further, the interconnect layers 141 can have larger areas when forming it on the contact plugs CP.

As described above, according to the embodiments of the present invention, it is possible to provide a semiconductor device in which the percentage of the barrier layer that occupies the cross section of the contact plug is relatively small, and to provide a method of manufacturing such a semiconductor device.

Although specific examples of the present invention have been described with reference to the first and second embodiments, the present invention is not limited to those embodiments.

The invention claimed is:

1. A semiconductor device comprising:
a substrate;
isolation layers and active regions formed in the substrate, and arranged alternately along a first direction parallel to a surface of the substrate;
an inter layer dielectric formed on the isolation layers and the active regions, and having holes for respective contact plugs on the respective active regions;
barrier layers formed in the holes, and formed on top surfaces of the active regions exposed in the holes and on one of two side surfaces of the respective holes in a section along the first direction; and
plug material layers formed in the holes, being in contact with the barrier layers, and being in contact with the other of the two side surfaces of the respective holes in the section along the first direction.

2. The device according to claim 1, wherein
the respective contact plugs are formed of the barrier layers and the plug material layers, and
a width between the contact plugs adjacent to each other in the first direction is different from a width of each of the isolation layers and the active regions in the first direction.

3. The device according to claim 1, wherein
the respective contact plugs are formed of the barrier layers and the plug material layers, and
a width of at least one of the contact plugs in the first direction is different from a width of each of the isolation layers and the active regions in the first direction.

4. The device according to claim 1, wherein
a height of the top surfaces of the active regions is higher than a height of top surfaces of the isolation layers.

5. The device according to claim 4, wherein
side surfaces of the active regions higher than the top surfaces of the isolation layers are exposed in the holes, and
the barrier layers are also formed on the side surfaces of the active regions exposed in the holes.

6. The device according to claim 1, wherein
the contact plugs are arranged in a zigzag alignment along the first direction, as viewed from above the substrate.

7. The device according to claim 1, wherein
the respective contact plugs are formed of the barrier layers and the plug material layers, and
the barrier layers of the contact plugs adjacent to each other in the first direction are placed at symmetrical positions in the first direction.

8. The device according to claim 1, wherein
the respective contact plugs are formed of the barrier layers and the plug material layers, and
the contact plugs adjacent to each other in the first direction at the same position in a second direction perpendicular to the first direction are placed to sandwich at least one active region in the first direction.

9. A semiconductor device comprising:
a substrate;
isolation layers and active regions formed in the substrate, and arranged alternately along a first direction parallel to a surface of the substrate;
an inter layer dielectric formed on the isolation layers and the active regions, and having first and second holes for first and second contact plugs on first and second active regions of the active regions, the first and second holes being adjacent to each other in the first direction;
a first barrier layer formed in the first hole, and formed on a top surface of the first active region exposed in the first hole and on one of two side surfaces of the first hole in a section along the first direction, the one of the two side surfaces of the first hole being opposite the second hole;
a second barrier layer formed in the second hole, and formed on a top surface of the second active region exposed in the second hole and on one of two side surfaces of the second hole in the section along the first direction, the one of the two side surfaces of the second hole being opposite the first hole;
a first plug material layer formed in the first hole, being in contact with the first barrier layer, and being in contact with the other of the two side surfaces of the first hole in the section along the first direction; and
a second plug material layer formed in the second hole, being in contact with the second barrier layer, and being in contact with the other of the two side surfaces of the second hole in the section along the first direction.

* * * * *